US010527893B2

(12) United States Patent
Nagasawa et al.

(10) Patent No.: US 10,527,893 B2
(45) Date of Patent: Jan. 7, 2020

(54) PIXEL ARRAY SUBSTRATE STRUCTURE, METHOD OF MANUFACTURING PIXEL ARRAY SUBSTRATE STRUCTURE, DISPLAY DEVICE, AND ELECTRONIC APPARATUS

(71) Applicant: Japan Display Inc., Tokyo (JP)

(72) Inventors: Koichi Nagasawa, Aichi (JP); Masaya Tamaki, Kanagawa (JP); Shuji Hayashi, Kanagawa (JP); Masaaki Kabe, Kanagawa (JP); Yoko Fukunaga, Kanagawa (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/920,277

(22) Filed: Mar. 13, 2018

(65) Prior Publication Data

US 2018/0203307 A1    Jul. 19, 2018

Related U.S. Application Data

(63) Continuation of application No. 14/953,744, filed on Nov. 30, 2015, now Pat. No. 10,048,548, which is a
(Continued)

(30) Foreign Application Priority Data

Dec. 20, 2010 (JP) ................................. 2010-283487

(51) Int. Cl.
*G02F 1/1343* (2006.01)
*H01L 27/12* (2006.01)
(Continued)

(52) U.S. Cl.
CPC .... *G02F 1/134336* (2013.01); *G02F 1/13306* (2013.01); *G02F 1/13452* (2013.01);
(Continued)

(58) Field of Classification Search
CPC ......... G02F 1/134336; G02F 1/133707; G02F 1/13306; G02F 1/13452;
(Continued)

(56) References Cited

U.S. PATENT DOCUMENTS 6,894,754 B2    5/2005 Ueda
2001/0052889 A1   12/2001 Fukunishi
(Continued)

FOREIGN PATENT DOCUMENTS

CN    1327167 A    12/2001
CN    1727971 A    2/2006
(Continued)

OTHER PUBLICATIONS

Korean Office Action for application No. 10-2011-0129406 dated Apr. 12, 2018.
(Continued)

*Primary Examiner* — Charles S Chang
(74) *Attorney, Agent, or Firm* — Michael Best & Friedrich LLP

(57) ABSTRACT

A pixel array substrate structure includes: first and second planarizing films sequentially stacked on a substrate where a circuit unit is formed; and a relay wire formed between the first and second planarizing films, in which the relay wire electrically connects a first contact portion formed on the first planarizing film and connected to the circuit unit with a second contact portion formed at a position different from the first contact portion when seen from above, on the second planarizing film.

14 Claims, 22 Drawing Sheets

Related U.S. Application Data continuation of application No. 13/305,320, filed on Nov. 28, 2011, now Pat. No. 9,224,759.

(51) Int. Cl.
*G02F 1/133* (2006.01)
*G02F 1/1337* (2006.01)
*G02F 1/1345* (2006.01)

(52) U.S. Cl.
CPC ...... *G02F 1/133707* (2013.01); *H01L 27/124* (2013.01); *G02F 2001/133742* (2013.01); *G02F 2001/134345* (2013.01); *H01L 27/1248* (2013.01)

(58) Field of Classification Search
CPC ........ G02F 2001/133742; G02F 2001/134345; H01L 27/124; H01L 27/1248
USPC ......................................................... 349/48
See application file for complete search history.

(56) References Cited

U.S. PATENT DOCUMENTS

| | | | |
|---|---|---|---|
| 2001/0053559 A1 | 12/2001 | Nagao et al. | |
| 2006/0023137 A1* | 2/2006 | Kamada | G02F 1/136213 349/44 |
| 2006/0131585 A1 | 6/2006 | Kim et al. | |
| 2008/0218669 A1 | 9/2008 | Nishimura et al. | |
| 2009/0066893 A1 | 3/2009 | Tsai et al. | |
| 2009/0128473 A1 | 5/2009 | Yamashita et al. | |
| 2009/0147165 A1 | 6/2009 | Kim et al. | |
| 2010/0253896 A1 | 10/2010 | Mochizuki et al. | |
| 2011/0043498 A1* | 2/2011 | Tsubata | G02F 1/13624 345/204 |
| 2011/0134099 A1* | 6/2011 | Tsubata | G02F 1/13624 345/211 |
| 2011/0141376 A1 | 6/2011 | Tsubata | |
| 2011/0149172 A1 | 6/2011 | Tsubata | |

FOREIGN PATENT DOCUMENTS

| | | |
|---|---|---|
| CN | 1848433 A | 10/2006 |
| CN | 101755234 B | 6/2010 |
| EP | 2 061 025 A2 | 5/2009 |
| JP | 2000-352716 A | 12/2000 |
| JP | 2001-284342 | 10/2001 |
| JP | 2005-274777 A | 10/2005 |
| JP | 2005-300579 | 10/2005 |
| JP | 2006-72088 A | 3/2006 |
| JP | 2006-196674 A | 7/2006 |
| JP | 2006-317904 A | 11/2006 |
| JP | 2009-122401 A | 6/2009 |
| JP | 2009-294572 A | 12/2009 |
| KR | 10-2006-0070345 A | 6/2006 |
| KR | 10-2009-0060756 A | 6/2009 |
| WO | WO-2009-013855 A1 | 1/2009 |
| WO | WO-2010-024058 | 3/2010 |
| WO | WO-2010/024059 A1 | 3/2010 |

OTHER PUBLICATIONS

Chinese Office Action dated May 2, 2018 for corresponding Chinese Patent Application No. 201610349202.6.
U.S. Office Action dated Jun. 4, 2013 in U.S. Appl. No. 13/305,315.
United States Office Action dated Dec. 24, 2013, for corresponding U.S. Appl. No. 13/305,316.
Taiwanese Office Action dated Sep. 16, 2014, for corresponding Taiwanese Application No. 100145320.
Chinese Office Action dated Mar. 24, 2015, for corresponding Chinese Application No. 2011104281335.
Japanese Office Action dated Mar. 15, 2016, for corresponding Japanese Patent Application No. 2014-214862.
Extended European Search Report dated Apr. 4, 2012, for corresponding European Application No. 11 19 2867.
Japanese Office Action dated Aug. 18, 2015, for corresponding Japanese Application No. 2014-214862.
Chinese Office Action dated Jun. 25, 2015, for corresponding Chinese Application No. 2011-10424978.7.
Chinese Office Action for corresponding Chinese Patent Application No. 201610349202.6 dated Dec. 29, 2018.

* cited by examiner

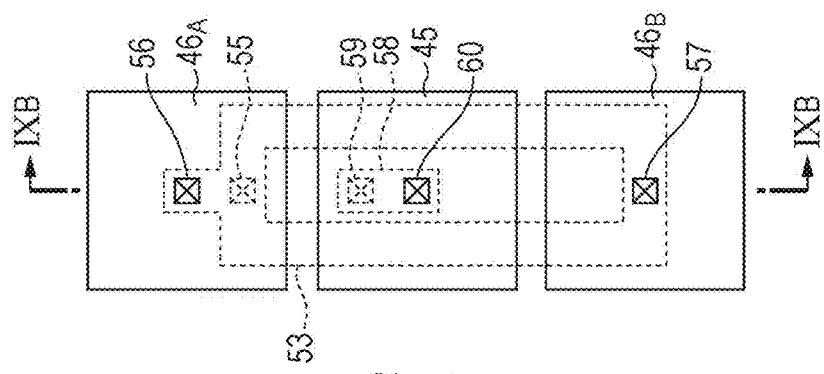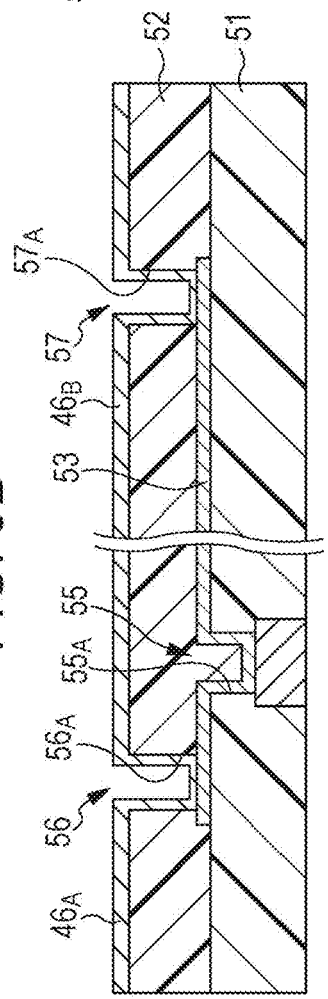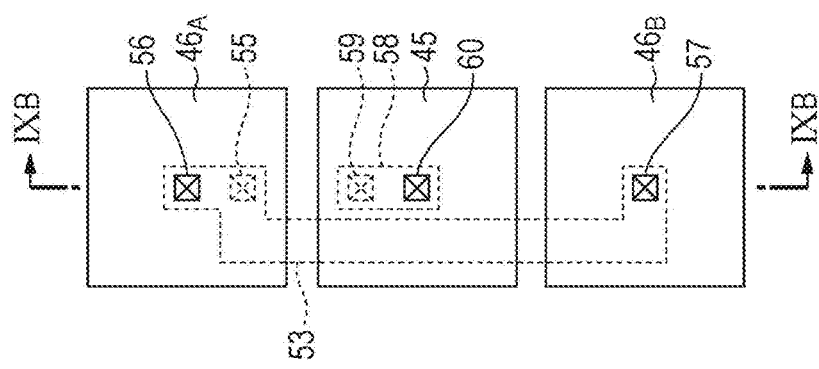

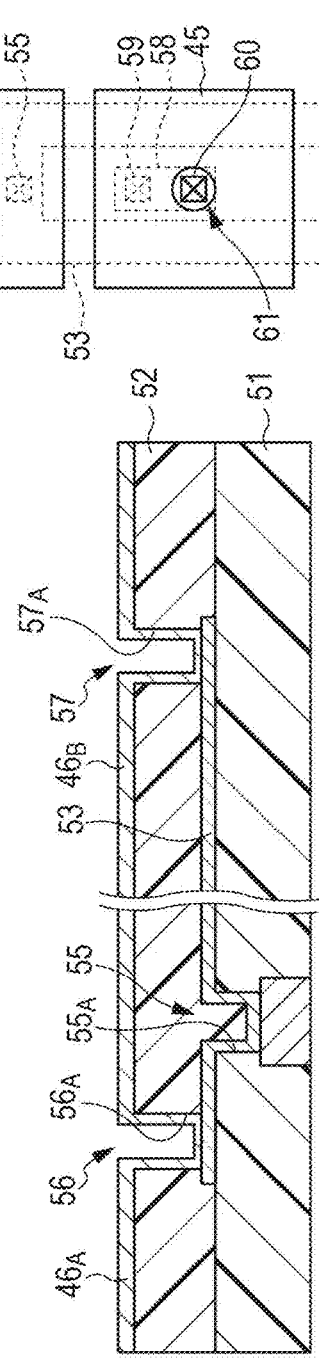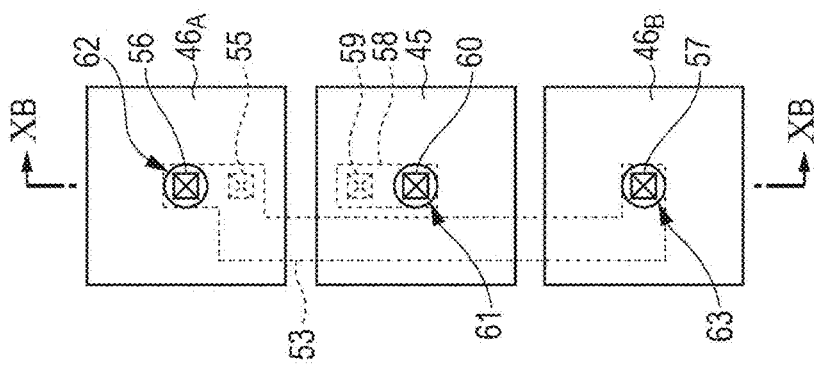

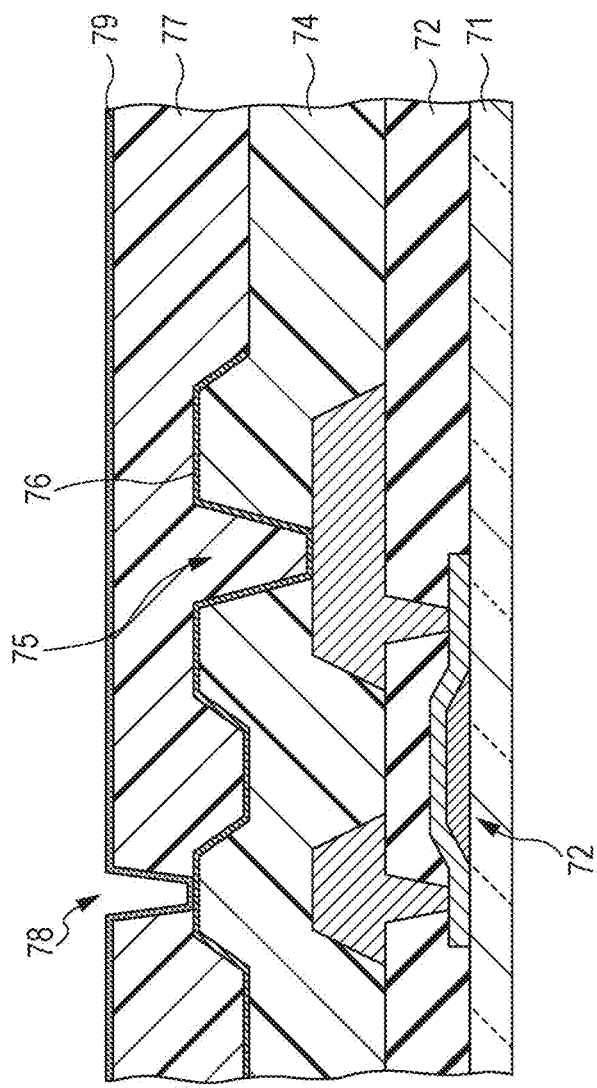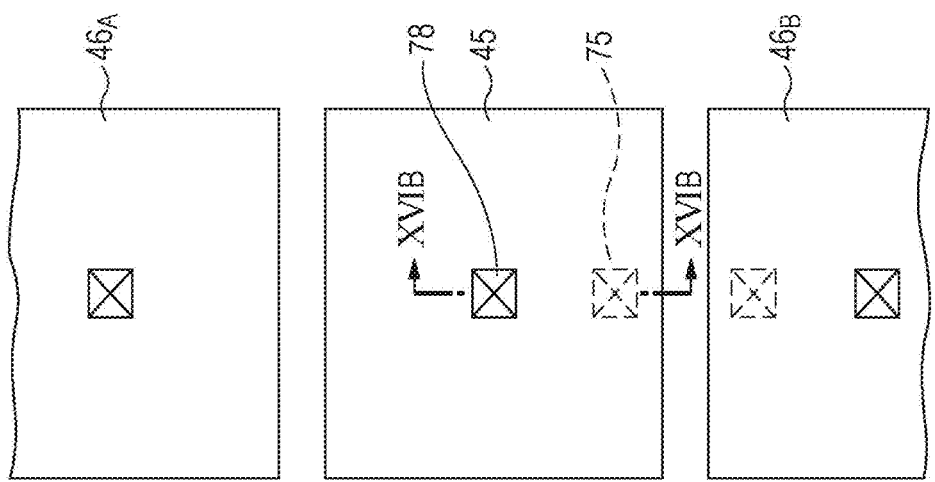

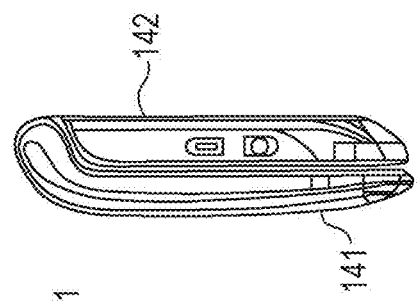
FIG. 22A
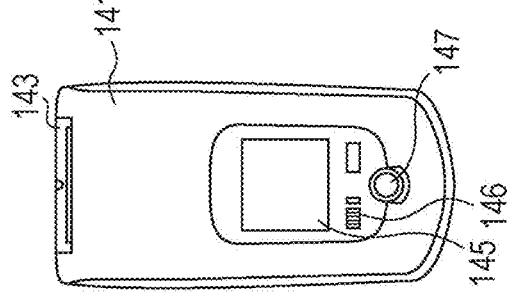
FIG. 22B
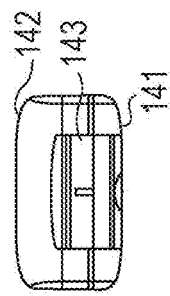 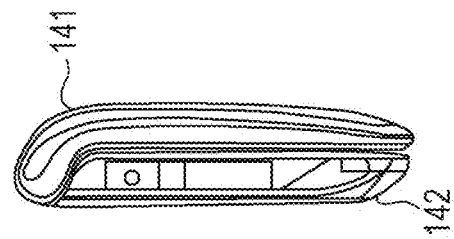 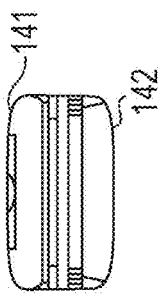
FIG. 22F  FIG. 22C  FIG. 22G
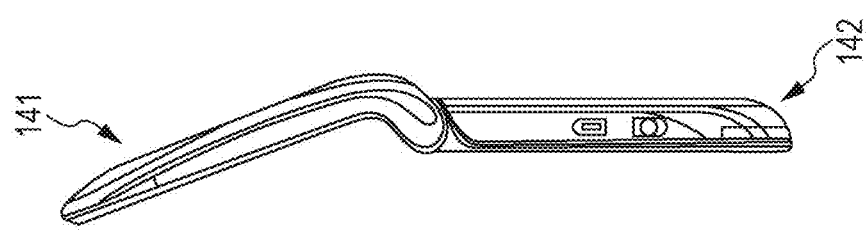
FIG. 22D
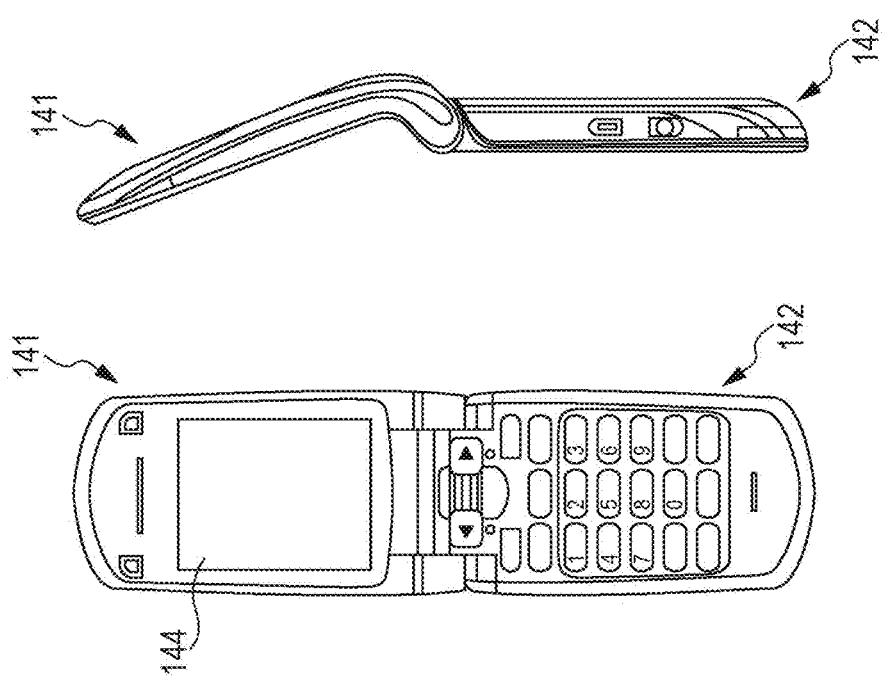
FIG. 22E

US 10,527,893 B2

PIXEL ARRAY SUBSTRATE STRUCTURE, METHOD OF MANUFACTURING PIXEL ARRAY SUBSTRATE STRUCTURE, DISPLAY DEVICE, AND ELECTRONIC APPARATUS

CROSS REFERENCE TO RELATED APPLICATIONS

This is a Continuation of application Ser. No. 14/953,744, filed Nov. 30 2015, which is a Continuation of application Ser. No. 13/305,320, filed Nov. 28, 2011, now U.S. Pat. No. 9,224,759, issued Dec. 29, 2015, which claims priority from Japanese Priority Patent Application JP 2010-283487 filed Dec. 20, 2010, the entire contents of which are incorporated herein by reference.

BACKGROUND

The present disclosure relates to a pixel array substrate structure, a method of manufacturing a pixel array substrate structure, a display device, and an electronic apparatus.

In display devices, circuit components, such as a thin film transistor, are formed on a substrate, and wires or contact portions are present, such that the substrate surface is uneven. A planarizing film that covers the circuit unit including transistors and the like is formed to remove the unevenness. Further, a technique of forming two layers of planarizing films has been proposed to further planarize the substrate surface (for example, see Japanese Unexamined Patent Application Publication No. 2001-284342).

In the related art of Japanese Unexamined Patent Application Publication No. 2001-284342, although two layers of planarizing films are formed, the contact portions formed in the planarizing films at the two upper and lower layers are at the same positions in the first layer and the second layer when seen from above. Accordingly, the arrangement positions of the contact portions of the second-layer planarizing film are restricted by the circuit pattern of the circuit unit where the contact portions of the first-layer planarizing film are connected, such that it is difficult to freely layout the contact portions of the second-layer planarizing film.

Further, since the contact portions of the second-layer planarizing film are electrically connected to the pixel electrodes formed on the second-layer planarizing film, they influence the image grade, that is, they become factors determining the display grade of a display. As described above, it is difficult in the related art to freely layout the contact portions, which influences the image grade, of the second-layer planarizing film.

It is desirable to provide a pixel array substrate structure having an improved degree of freedom in the layout of contact portions of a second-layer planarization, which influences the image grade, a method of manufacturing the pixel array substrate structure, a display device having the pixel array substrate structure, and an electronic apparatus including the display device.

SUMMARY

A pixel array substrate structure according to an embodiment of the present disclosure, includes: first and second planarizing films sequentially stacked on a substrate on which a circuit unit is formed; and a relay wire formed between the first and second planarizing films, wherein the relay wire electrically connects a first contact portion formed on the first planarizing film and connected to the circuit unit to a second contact portion formed at a position different from that of the first contact portion when seen from above, on the second planarizing film.

In the pixel array substrate structure having the configuration, the planarizing film formed for the purpose of planarization on the substrate where the circuit unit is formed has a two-layer structure implemented by sequentially stacking the first and second planarizing films, such that it is possible to more reliably remove surface roughness due to unevenness of the wire of the circuit as compared with a planarizing film having a single-layer structure. Further, since the relay wire is disposed between the first contact portion and the second contact portion, even if the circuit density of the circuit unit where the first contact portion is connected increases, the disposed position of the second contact portion is not restricted by the circuit pattern. In other words, it is possible to achieve free layout of the second contact portion influencing the image grade, which is formed in the second planarizing film.

According to the embodiment of the present disclosure, since it is possible to more certainly remove surface roughness due to unevenness of the wire of the circuit and it is possible to improve the degree of freedom in the layout of the second-layer (second) planarizing film, it is possible to provide a display device having a high display grade.

BRIEF DESCRIPTION OF THE DRAWINGS

FIGS. 9A, 9B and 9C are illustrative views of the pixel structure according to a first embodiment of the three-division pixel employing the area gradation method, in which FIG. 9A or 9C is a plan view showing three sub-pixel electrodes and FIG. 9B is a cross-sectional view taken along the line IXB-IXB of FIG. 9A or 9C.

FIGS. 10A, 10B and 10C are illustrative views of the pixel structure according to a second embodiment of the three-division pixel employing the area gradation method, in which FIG. 10A or 10C is a plan view showing three sub-pixel electrodes and FIG. 10B is a cross-sectional view taken along the line XB-XB of FIG. 10A or 10C.

FIGS. 15A and 15B are illustrative views of a pixel circuit when a first-layer planarizing film is formed, in which FIG. 15A is a plan pattern view schematically showing a plan pattern and FIG. 15B is a cross-sectional view showing the structure taken along the line XVB-XVB in FIG. 15A.

FIGS. 16A and 16B are illustrative views of a pixel circuit after a pixel electrode is formed, in which FIG. 16A is a plan pattern view schematically showing a plan pattern and FIG. 16B is a cross-sectional view showing the structure taken along the line XVIB-XVIB in FIG. 16A.

FIGS. 20A and 20B are perspective views showing the external appearance of a digital camera using an embodiment of the present disclosure, in which FIG. 20A is a perspective view seen from the front side and FIG. 20B is a perspective view seen from the rear side.

FIGS. 22A to 22G are external views showing a mobile phone using an embodiment of the present disclosure, in which FIG. 22A is a front view, FIG. 22B is a side view, FIG. 22C is a front view with the phone closed, FIG. 22D is a left side view, FIG. 22E is a right side view, FIG. 22F is a plan view, and FIG. 22G is a bottom view.

DETAILED DESCRIPTION OF EMBODIMENTS

Configurations for implementing the present disclosure (hereafter, referred to as "embodiments") are described hereinafter in detail with reference to the accompanying drawings. Further, it is assumed that the description is provided in the following order.

1. Display Device According to Embodiment
1-1. System Configuration
1-2. MIP type Pixel Configuration
1-3. Rewriting of Pixel Data
1-4. Area Gradation Method
1-5. Pixel Structure According to Embodiment
1-6. Specular Reflection
1-7. Pixel Array Substrate Structure According to Embodiment
2. Modified Example
3. Electronic apparatus <1. Display Device According to Embodiment>

Figure 1:
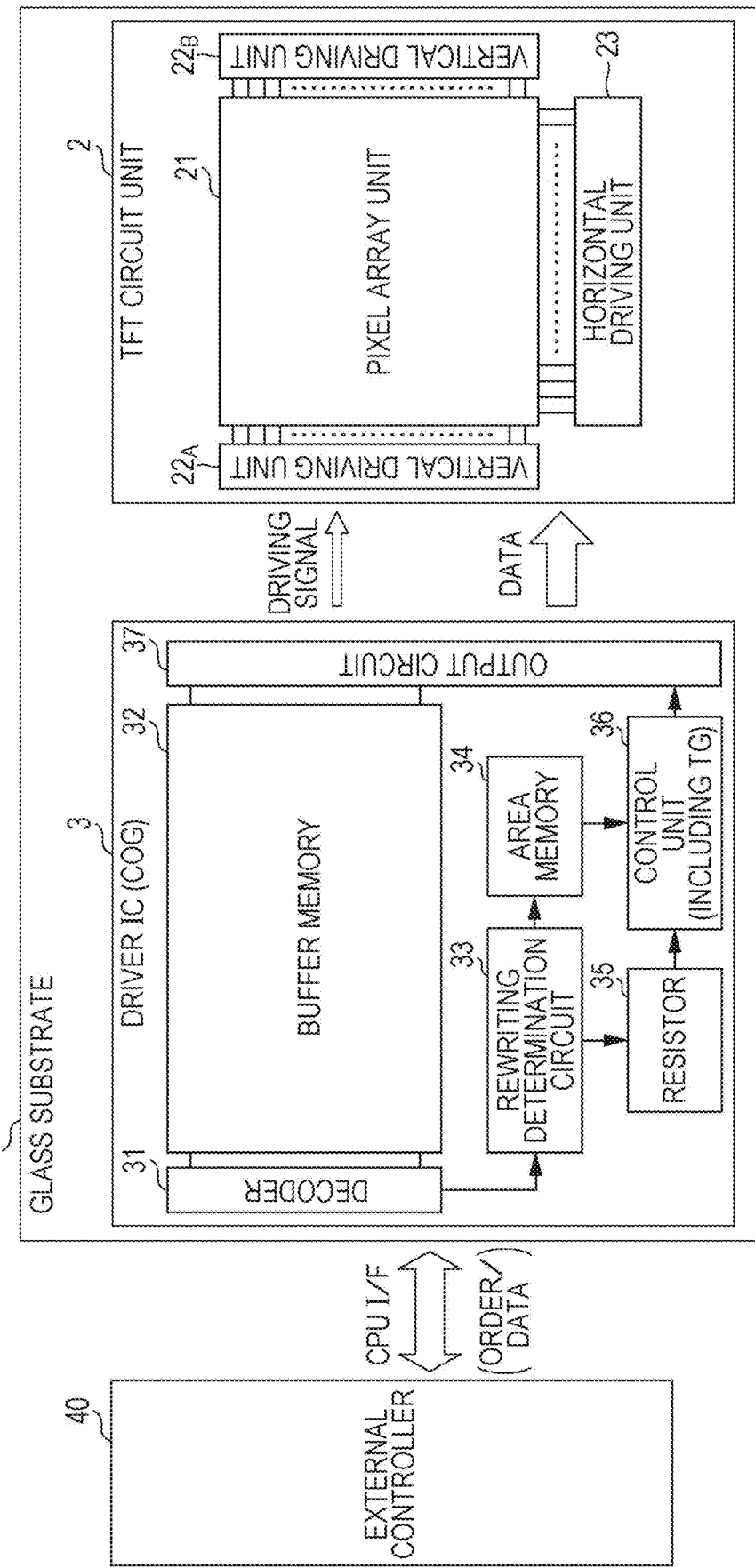
FIG. 1 is a block diagram showing an example of a system configuration of a display device according to an embodiment of the present disclosure.

FIG. 1 is a block diagram showing an example of a system configuration of a display according to an embodiment of the present disclosure. In this embodiment, a so-called MIP (Memory In Pixel) type reflective liquid crystal display (LCD), which has a memory that can store data for each pixel is exemplified.

The MIP type reflective liquid crystal display can implement display of an analog display mode and display of a memory display mode as a result of having a memory that stores data in a pixel. The analog display mode is a display mode in which the gradation of a pixel is displayed in an analog manner.

Further, the memory display mode is a display mode in which the gradation of a pixel is displayed in a digital manner on the basis of binary information (logic "1"/logic "0") stored in the memory in a pixel.

Since information held in the memory is used in the memory display mode, it is not necessary to perform writing of a signal potential reflecting the gradation in a frame period. Therefore, low power consumption can be implemented, that is, it is possible to reduce the power consumed by a liquid crystal display in the memory display mode, as compared with the analog display mode that is necessary to perform writing of signal potential reflecting the gradation of a pixel in a frame period.

The MIP type reflective liquid crystal display can display only two gradations of one bit for each pixel. Therefore, the MIP type reflective liquid crystal display according to the embodiment employs an area gradation method as a method of expressing gradation. The area gradation method is a gradation expression in which four gradations of two bits are expressed by providing a pixel area (area of a pixel electrode) with, for example, a weight of 2:1.

The area gradation method is described in detail below.

[1-1. System Configuration]

The system configuration of the MIP type reflective liquid crystal display according to the embodiment is described first with reference to FIG. 1.

As shown in FIG. 1, an MIP type reflective liquid crystal display 10 according to the embodiment has a modular configuration with a TFT circuit unit 2 formed on a transparent substrate 1 (for example, a glass substrate) and a driver IC 3 mounted on the substrate 1 by a COG (Chip On Glass) method. In the MIP type reflective liquid crystal display 10 having a modular configuration (LCD module), various commands are supplied through a CPU interface (I/F) from an external controller 40 (or CPU).

(TFT Circuit Unit)

In the LCD module 10, the TFT circuit unit 2 includes a pixel array unit 21, vertical driving units $22_A$ and $22_B$, and a horizontal driving unit 23. Further, in the configuration of the TFT circuit unit 2, only the minimum necessary functions of the TFT circuit unit 2 are shown in the block diagram and the TFT circuit unit 2 is not limited to this configuration.

Figure 2:
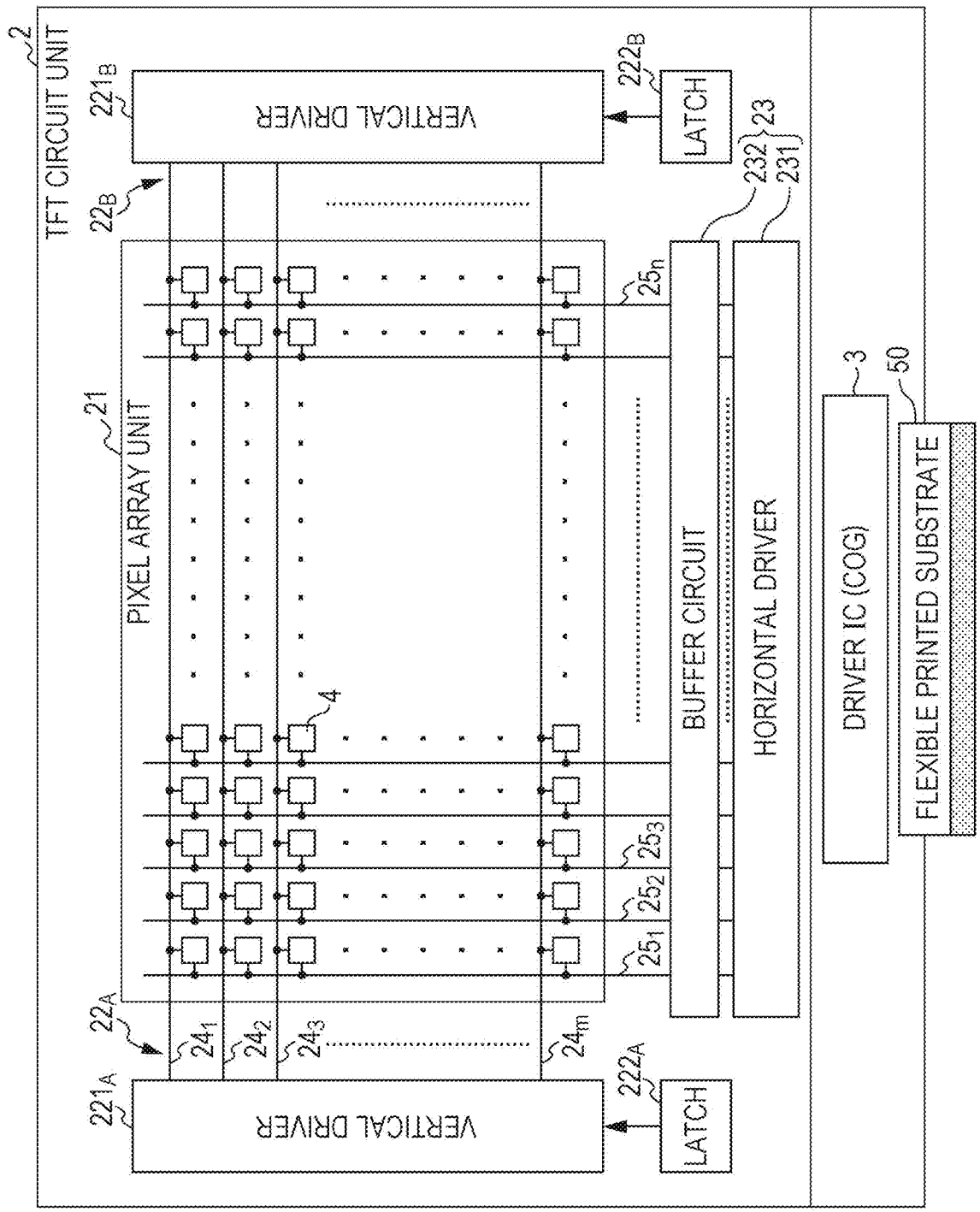
FIG. 2 is a block diagram showing an example of a detailed configuration of a TFT circuit unit.

FIG. 2 shows an example of a detailed configuration of the TFT circuit unit 2. As shown in the figure, in the pixel array unit 21, pixels 4 each including a built-in memory that can store data are arranged two-dimensionally in a matrix pattern (array pattern), whereby a display unit is implemented. The circuit configuration of the pixel 4 (MIP type pixel) with the built-in memory is described in detail below.

In the pixel array unit 21, scanning lines $24_1$ to $24_m$ are disposed in the row direction of each row (the arrangement direction of the pixels in the pixel rows) in an m-row×n-column arrangement. Both ends of each of the scanning lines $24_1$ to $24_m$ are connected to the output end in the corresponding row of the vertical driving units $22_A$ and $22_B$. Further, in the pixel array unit 21, signal lines $25_1$ to $25_n$ are disposed in the column direction of each column (the arrangement direction of the pixels in the pixel columns) in a m-row×n-column arrangement. One end of each of the signal lines $24_1$ to $24_n$ is connected to the output end in the corresponding column of the horizontal driving unit 23.

The vertical driving units $22_A$ and $22_B$ include vertical drivers $221_A$ and $221_B$ and V-address latches $222_A$ and $222_B$.

The vertical drivers $221_A$ and $221_B$ can arbitrarily select the pixels 4 of the pixel array unit 21 for each pixel column. The V-address latches $222_A$ and $222_B$ store information on the column addresses transmitted from the driver IC 3, that is, vertical (V) addresses.

The vertical drivers $221_A$ and $221_B$ are implemented using, for example, decoders. The vertical drivers $221_A$ and $221_B$ implemented using decoders output scanning signals for activating the pixels 4 of the pixel columns designated by the address information, on the basis of the address information stored in the V-address latches $222_A$ and $222_B$.

As the vertical drivers $221_A$ and $221_B$ are implemented using decoders, they can appropriately select the pixel columns, that is, designate the addresses. Therefore, when the data of the pixels 4 in the pixel array unit 21 is rewritten, it is possible to rewrite the data in a specific region (window) with the address designated for each pixel column, in addition to the data for one screen.

Further, in this configuration, although the vertical driving units $22_A$ and $22_B$ are disposed at the left and right sides of the pixel array unit 21, this is just an example. That is, the vertical driving units $22_A$ and $22_B$ may be disposed at one of the left and right sides of the pixel array unit 21. However, from the viewpoint of suppressing propagation delay of the scanning signals output from the vertical driving units $22_A$ and $22_B$ to the minimum, it is preferable to dispose the vertical driving units $22_A$ and $22_B$ at both the left and right sides of the pixel array unit 21 in comparison to disposing them at one side.

As shown in FIG. 2, the horizontal driving circuit 23 is composed of a horizontal driver 231 and a buffer circuit 232 and writes pixel data for the pixels 4 in pixel columns selected by the vertical driving units $22_A$ and $22_B$. As methods of writing pixel data employed by the horizontal driving circuit 23, various methods can be employed, such as a line-sequential method in which pixel data for the pixels 4 in a selected column is collectively written or a point-sequential method in which the pixel data for each pixel of the pixels 4 in a selected column is sequentially written.
(Driver IC)

In FIG. 1, the driver IC 3 includes a decoder 31, a buffer memory (memory unit) 32, a rewriting determination circuit 33, an area memory 34, a resistor 35, a control unit 36, and an output circuit 37, and is mounted on the transparent substrate 1 by COG, the same as the TFT circuit unit 2, as described above. Further, in the configuration of the driver IC 3, only the minimum necessary functions of the driver IC 3 are shown in the block diagram and the driver IC 3 is not limited to this configuration.

In the driver IC 3, data or a command is supplied to the decoder 31 from an external controller 40, for example, through a flexible printed board 50 (see FIG. 2). The data supplied to the decoder 31 is data (image data/image data) for rewriting the data held in the memories of the pixels 4 in the pixel array unit 21.

The command supplied to the decoder 31 is a command for instructing rewriting of data of a pixel 4 in the pixel array unit 21. Information on the timing or the region at which rewriting of the data is to start is included in the command. In detail, for example, region information on the region where the data is to be rewritten, that is, information on XY-start address and XY-end address or information, such as a rewriting instruction that instructs rewriting of the data, is included in the command.

In this configuration, data used for rewriting and the command instructing rewriting (for example, a screen refresh command) are data for the decoder 31 from the external controller 40 and then transmitted in the command order sequentially in time.

The decoder 31 separates the data and the command supplied from the external controller 40 and supplies the data to the buffer memory 32 and the command to the rewriting determination circuit 33. The buffer memory 32 temporarily stores and holds the data supplied from the external controller 40 through the flexible printed board 50 and the decoder 31 in order to rewrite the data of a pixel 4 in the pixel array unit 21.

As the buffer memory 32, it is possible to use, for example, a frame memory that can store data for one screen displayed by the pixels 4 in the pixel array unit 21. However, the buffer memory 32 is not limited to a frame memory. When the buffer memory 32 is implemented by a frame memory, the buffer memory 32 can store the pixel data of the region where data is to be rewritten, for example, with a one-to-one correspondence relationship for the XY-address of a pixel 4 in the pixel array unit 21.

The rewriting determination circuit 33 makes a determination regarding (analyzes) the command supplied from the decoder 31 and transmits the information on the XY-start address or the XY-end address of the rewriting region included in the command to the area memory 34 and transmits the screen refresh command showing the start timing of rewriting of data to the resistor 35. The area memory 34 stores the information on the XY-start address or the XY-end address of the region where data is to be rewritten, which is transmitted from the rewriting determination circuit 33. The resistor 35 stores the screen refresh command transmitted from the rewriting determination circuit 33.

The control unit 36 includes a timing generator (TG). The timing generator generates various timings for determining a timing of writing or reading data for the buffer memory 32 or a timing of driving the vertical driving units $22_A$ and $22_B$ or the horizontal driving unit 23 under the control of the control unit.

The control unit 36 starts an operation for rewriting data on the basis of the screen refresh command stored in the resistor 35, when the data of the pixels 4 in the pixel array unit 21 is rewritten. Further, the controller 36 performs timing control for various timing signals generated from the timing generator on the basis of the information on the XY-start address or the XY-end address of the region where the data stored in the area memory 34 is to be rewritten.

The output circuit 37 reads the data stored in the buffer memory 32 on the basis of various timing signals transmitted from the control unit 36 and outputs the data to the TFT circuit unit 2, in detail, the horizontal driving unit 23 in the TFT circuit unit 2. Further, the output circuit 37 outputs a driving signal for driving the vertical driving units $22_A$ and $22_B$ or the horizontal driving unit 23 to the TFT circuit unit 2 on the basis of various timing signals transmitted from the control unit 36.

[1-2. MIP type Pixel Configuration]

Next, the circuit configuration of the pixel 4 (MIP type pixel) with the built-in memory is described in detail.

Figure 3:
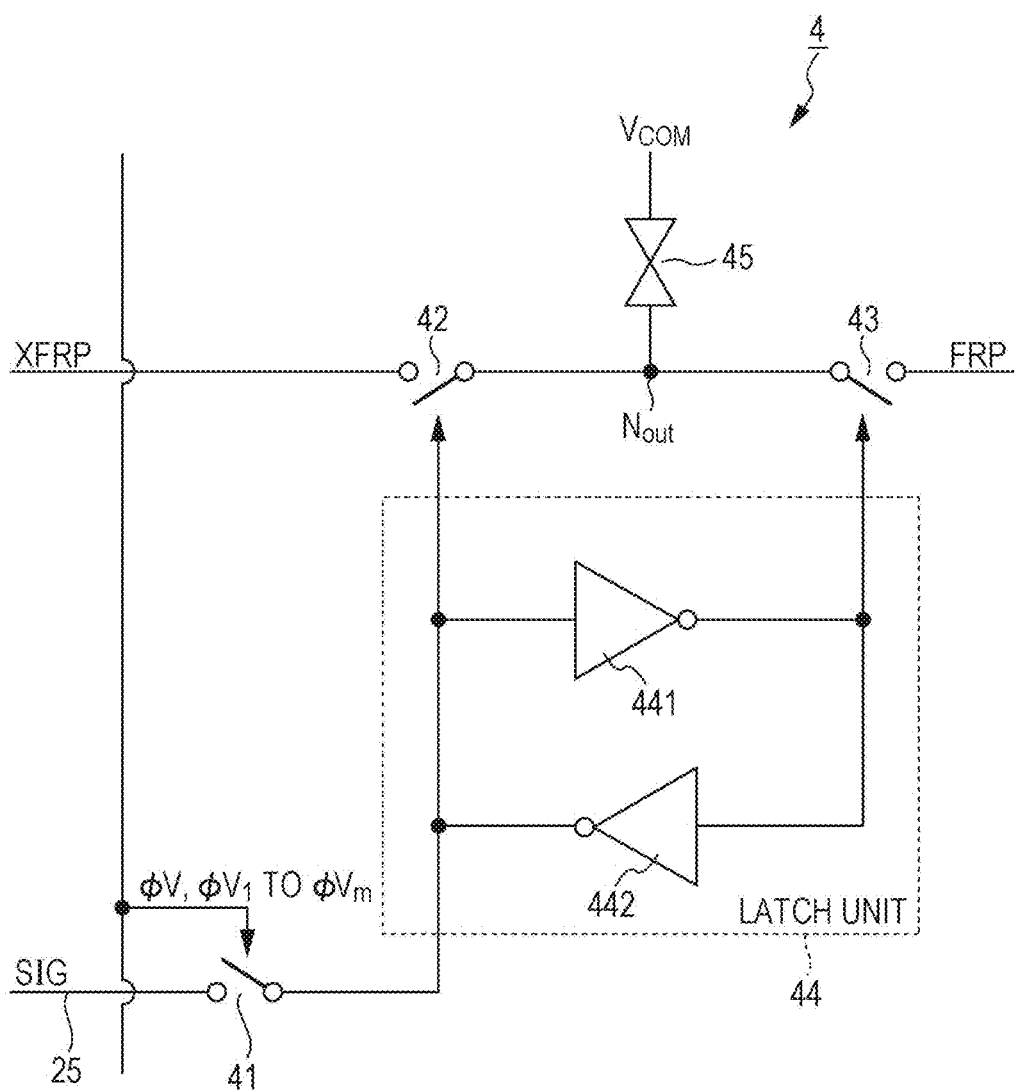
FIG. 3 is a block diagram showing an example of the circuit configuration of an MIP type pixel.

FIG. 3 is a block diagram showing an example of the configuration of an MIP type pixel 4.

Figure 4:
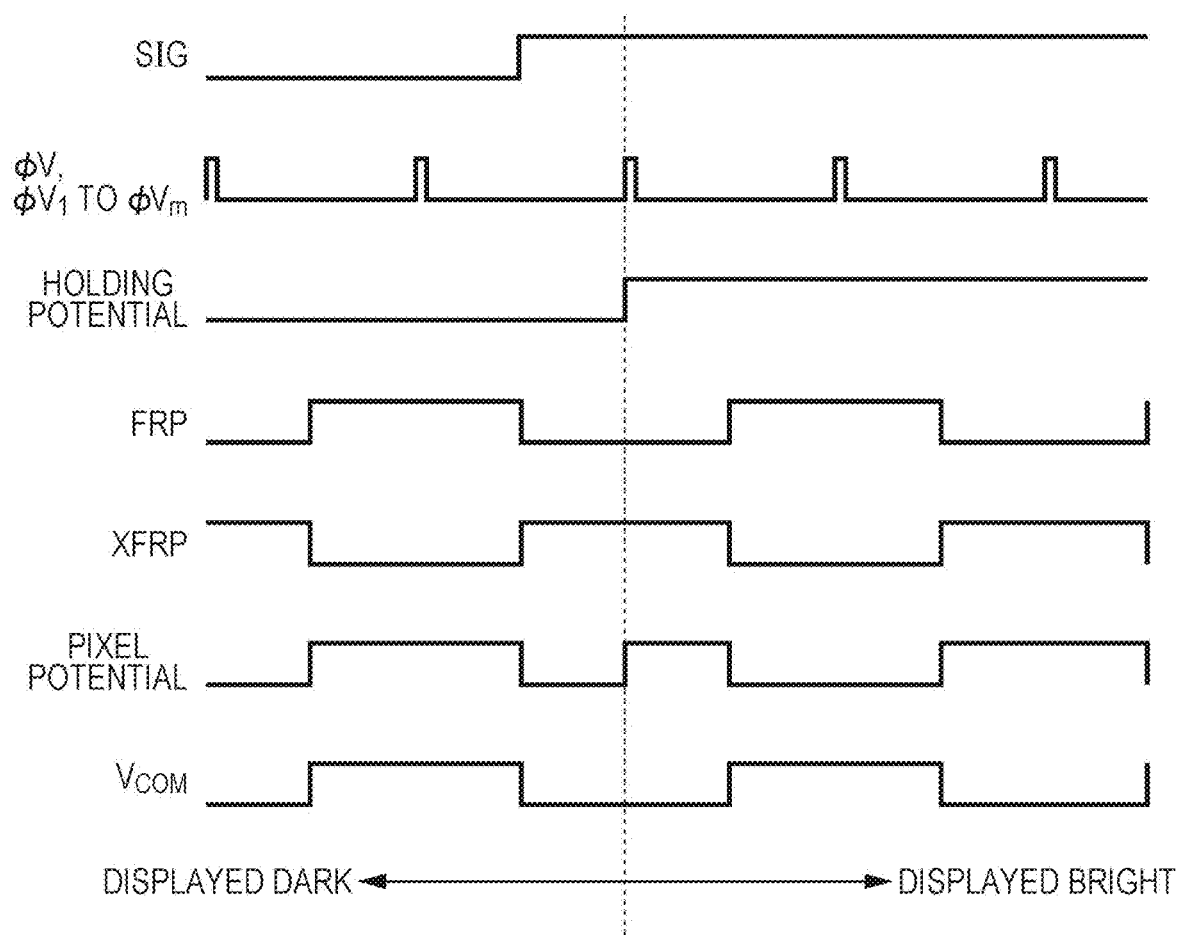
FIG. 4 is a timing chart provided to illustrate the operation of the MIP type pixel.

As shown in FIG. 3, a pixel 4 has a pixel configuration having an SRAM function which includes three switch elements 41 to 43, a latch unit 44, and a liquid crystal cell 45. In this configuration, the liquid crystal cell 45 means the liquid crystal capacitance generated between a pixel electrode and an opposite electrode disposed opposite the pixel electrode. In FIG. 4, a timing chart is provided for illustrating the operation of the MIP type pixel 4.

The switch element 41 is connected to the signal line 25 ($25_1$ to $25_n$) at one end, and is turned on (closed) in response to a scanning signal φV (φ$V_1$ to φ$V_m$) transmitted from the vertical driving units $22_A$ and $22_B$ and receives data SIG supplied through the signal line 25 ($25_1$ to $25_n$). The latch unit 44 is composed of inverters 441 and 442, which are connected in parallel with each other and oriented in opposite directions, and holds (latches) a potential in accordance with the data SIG received by the switch element 41.

One of the switch elements 42 and 43 is turned on in accordance with the holding potential of the latch unit 44 and transmits a control pulse FRP having the same phase as the common potential $V_{com}$ or a control pulse XFRP having the a phase inverse to that of the pixel electrode, for the liquid crystal cell 45 where the common potential $V_{com}$ is applied to the opposite electrode. A node where one end of each of the switch elements 42 and 43 is connected to the common electrode is the output node $N_{out}$ of the pixel circuit.

As seen from FIG. 4, when the polarity of the holding potential of the latch unit 44 is negative, the liquid crystal cell 45 displays dark because the pixel potential has the same phase as the common potential $V_{COM}$, and when the polarity of the holding potential of the latch unit 44 is positive, the liquid cell 45 displays white because the pixel potential has a phase inverse to that of the common potential $V_{COM}$.

Figure 5:
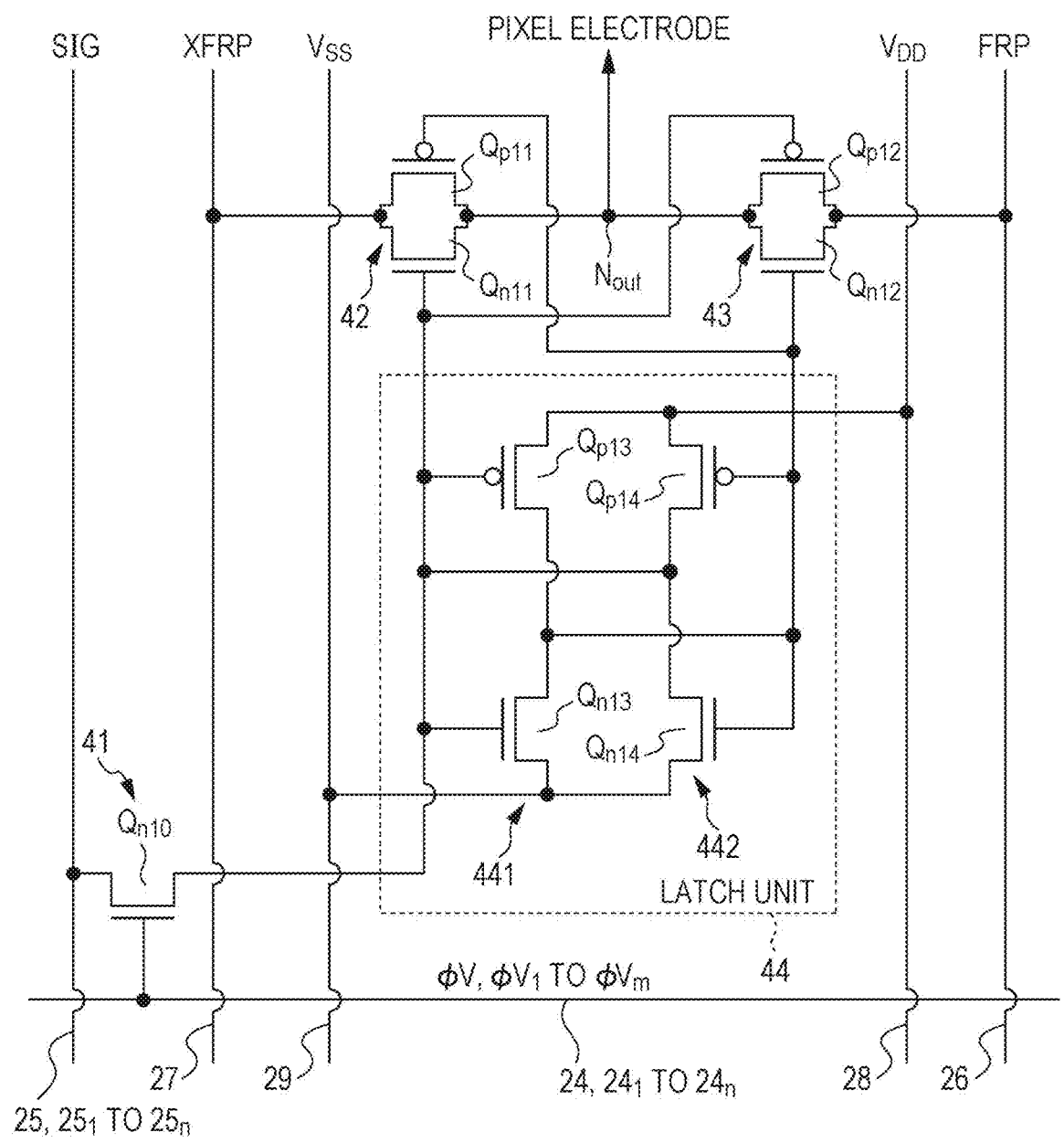
FIG. 5 is a circuit diagram showing an example of a detailed circuit configuration of the MIP type pixel.

FIG. 5 is a circuit diagram showing an example of a detailed circuit configuration of the pixel 4, in which the components corresponding to those of FIG. 3 are given the same reference numerals.

In FIG. 5, the switch element 41 is, for example, implemented by an NchMOS transistor $Q_{n10}$. In the NchMOS transistor $Q_{n10}$, a source/drain is connected to the signal line 25 ($25_1$ to $25_n$) and a gate is connected to the scanning line 24 (scanning lines $24_1$ to $24_m$).

The switch elements 42 and 43 are implemented, for example, by transfer switches in which an NchMOS transistor and a PchMOS transistor are connected. In detail, the switch element 42 has a configuration in which an NchMOS transistor $Q_{n11}$ and a PchMOS transistor $Q_{P11}$ are connected in parallel. The switch element 43 has a configuration in which an NchMOS transistor $Q_{n12}$ and a PchMOS transistor $Q_{P12}$ are connected in parallel.

The switch elements 42 and 43 are not necessarily transfer switches in which an NchMOS transistor and a PchMOS transistor are connected in parallel. The switch elements 42 and 43 may be implemented by a single conductive MOS transistor, that is, an NchMOS transistor or a PchMOS transistor. The common connection node of the switch elements 42 and 43 may be an output node $N_{out}$ of the pixel circuit.

The inverters 441 and 442 are both implemented, for example, by a CMOS inverter. In detail, the inverter 441 has a configuration in which the gates and drains of an NchMOS transistor $Q_{n13}$ and a PchMOS transistor $Q_{P13}$ are respectively connected to one another. The inverter 442 has a configuration in which the gates and drains of an NchMOS transistor $Q_{n14}$ and a PchMOS transistor $Q_{P14}$ are respectively connected to one another.

The pixels 4 based on the circuit configuration are horizontally and vertically developed and disposed in a matrix pattern. In the matrix pattern arrangement of the pixels 4, control lines 26 and 27 transmitting control pulses FRP and XFRP and power lines 28 and 29 of positive power voltage $V_{DD}$ and negative power voltage $V_{SS}$ are disposed in each column, in addition to the scanning lines 24 ($24_1$ to $24_m$) in each row and the signal line 25 ($25_1$ to $25_n$) in each column.

As described above, the active matrix type liquid crystal display 10 according to the embodiment has a configuration in which pixels (MIP) 4 with an SRAM function having the latch unit 44 holding the potential according to display data are disposed in a matrix pattern. Further, although it is exemplified in the embodiment when an SRAM is used as a memory with built-in pixels, the SRAM is just an example and memories having other configurations, for example, a DRAM may be used.

The MIP type active matrix type liquid crystal display 10 can implement display of an analog display mode and display of a memory display mode, as described above, by having a memory in each pixel 4. Further, for the memory display mode, it is not necessary to write a signal potential that reflects gradation in a frame period by performing display using pixel data held in the memory, such that there is an advantage in that it is possible to reduce the power consumption of a liquid crystal display.

Further, it is necessary to partially rewrite a displayed screen, that is, rewrite only a portion of a displayed screen. In this case, it is desirable to partially rewrite pixel data. When a displayed screen is partially rewritten, that is, pixel data is partially rewritten, it is not necessary to transmit data for a pixel that is not rewritten. Accordingly, there is an advantage in that it is possible to save power for a liquid crystal display because it is possible to reduce the amount of transmitted data.

[1-3. Rewriting of Pixel Data]

In an electronic apparatus equipped with the MIP type active matrix type liquid crystal display 10, it is necessary to partially rewrite a displayed screen, that is, rewrite a portion of a displayed screen. For this necessity, in the related art, a configuration of periodically rewriting data of a pixel 4 from the driver IC 3 (for example, with a period of 60 Hz) in synchronization with a synchronization signal (hereafter, simply referred to a "vertical synchronization signal $V_{sync}$"), such as a vertical synchronization signal $V_{sync}$, has been employed.

That is, in a system of the related art, pixel data is rewritten in synchronization with the vertical synchronization signal $V_{sync}$. Therefore, when display data used for rewriting is input to the driver IC 3 from the external controller 40, one screen is input in synchronization with the vertical synchronization signal $V_{sync}$ generated by the external controller 40. Alternatively, the vertical synchronization signal $V_{sync}$ is generated by the driver IC 3 and sent to the external controller 40, such that the external controller 40 inputs display data for one screen until the next vertical synchronization signal $V_{sync}$ is reached.

The reason for doing this is connected to the timing relationship between the timing of rewriting the pixel data and the timing of writing the display data from the external controller 40 to the buffer memory 32. That is, when, display data is simply written to the pixel 4 at a timing of the driver IC 3 side, there is a concern that a state may occur in which the former timing and the latter timing overlap or the latter timing overtakes the former timing.

The overtaking of the former timing by the latter timing is caused by the following reasons.

That is, as can be seen from the fact that the data transmission is synchronized with the vertical synchronization signal $V_{sync}$ between the external controller 40 and the driver IC 3, this is because the communication speed between the external controller 40 and the driver IC 3 is larger than the communication speed between the TFT circuit unit 2 and the driver IC 3. When the latter timing overtakes the former timing, the display switching deviates by one frame, such that a display defect, such as stripes, may be generated.

As described above, since the display data input from the outside is necessarily synchronized with the vertical synchronization signal $V_{sync}$ in the system of the related art, it is necessary to make display data for one screen that is to be newly displayed from now in advance externally and transmit the display data to the driver IC 3. However, in practice, when it is frequently necessary to rewrite a portion of the display screen, it is inefficient to transmit the display data for one screen in synchronization with the vertical synchronization signal $V_{sync}$.

The MIP type liquid crystal display 10 according to the embodiment employs a configuration in which rewriting is performed at a certain timing as a result of receiving a request for rewriting pixel data from a client, that is, the external controller 40, rather than rewriting of pixel data being synchronized with the vertical synchronization signal $V_{sync}$.

In detail, first, display data received from a client (external controller 40) is set data not for one screen, but for the pixels 4 included in the region that is to be rewritten and the partial display data is temporarily stored and held in the buffer memory 32. Since the display data held in the buffer memory 32 is not for one screen, it is not necessary for the buffer memory 32 to be a frame memory, that is, a memory that can store the display data for one screen.

The partial display data of the region to be rewritten is sent with a command for instructing rewriting from the external controller 40, for the driver IC 3 sequentially in time. For example, the display data is sent first for the driver IC 3 from the external controller 40 and a command (screen refresh command) for rewriting is sent after a predetermined time passes. As receiving the screen refresh command from the external controller 40, the driver IC 3 performs a process of rewriting the pixel data on the basis of the display data stored in the buffer memory 32, even when the vertical synchronization signal $V_{sync}$ is not provided for data transmission from the external controller 40.

Figure 6:
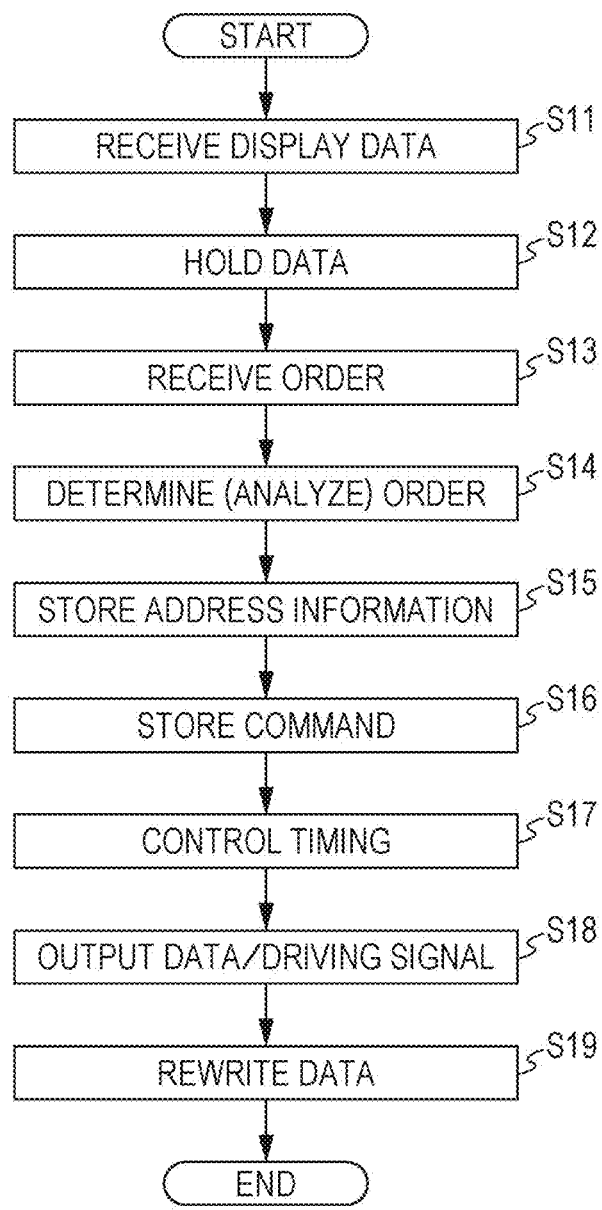
FIG. 6 is a flowchart showing a detailed process order of partial rewriting of pixel data in a driver IC.

A detailed process order of a partial rewriting process of pixel data in the driver IC 3 is described hereafter with reference to the flowchart of FIG. 6. The rewriting process is basically a process performed by the driver IC 3. The driver IC 3 receives data and commands sequentially in time from the external controller 40.

When receiving the display data to be used for rewriting (Step S11), the driver IC 3 first temporarily holds the display data in the buffer memory 32 and performs writing on the buffer memory 32 (Step S12). Next, upon receiving a command instructing rewriting (Step S13), the driver IC 3 supplies the command to the rewriting determination circuit 33 and the rewriting determination circuit 33 performs determination (analysis) (Step S14).

Further, the information on the XY-start address and the XY-end address of a region to be rewritten, which is included in the command, is stored in the area memory 34 (Step S15). Further, the screen refresh command, which is a command instructing rewriting of data, is stored in the resistor 35 (Step S16).

Next, when the screen refresh command is stored in the resistor 35, the control unit 36 receives the command and starts timing control for rewriting the data (Step S17). In detail, the control unit 36 performs timing control of the timing generator (TG) on the basis of the information on the XY-start address or the XY-end address stored in the area memory 34.

Further, when the data is temporarily held in the buffer memory 32, if the buffer memory 32 is a frame memory, it may be possible to control the region where the data is stored, under the control of the control unit 36 based on the XY-start address or the XY-end address.

Next, while the data stored in the buffer memory 32 is read and output to the TFT circuit unit 2 under the control of the control unit 36, a driving signal is output for the vertical driving units $22_A$ and $22_B$ or the horizontal driving unit 23 (Step S18). Further, pixel data is rewritten for each pixel row under the driving performed by the vertical driving units $22_A$ and $22_B$ or the horizontal driving unit 23 (Step S19).

In detail, the vertical driving units $22_A$ and $22_B$ sequentially selects, for example, the pixel rows (lines) included in the region (window) designated by the information on the XY-start address and the XY-end address. Meanwhile, the horizontal driving unit 23 writes the display data, which is supplied from the buffer memory 32 through the output circuit 37, to the pixels 4 in the selected row, in synchronization with the selection of the pixel row by the vertical driving units $22_A$ and $22_B$.

Through this series of processes, it is possible to perform the rewriting process at the timing of a request for rewriting, by receiving a request for rewriting from a client, rather than performing a process of rewriting pixel data synchronized with the vertical synchronization signal $V_{sync}$. Therefore, even though the display data input from the outside is synchronized with the vertical synchronization signal $V_{sync}$, it is possible to partially input a screen, rather than input the entire screen, to the driver IC3 and it is possible to perform the process of rewriting the pixel data at a certain timing.

As it is not necessary to perform synchronization with the vertical synchronization signal $V_{sync}$, when data is generated externally, it is not necessary to generate display data to be used for rewriting within the period of the vertical synchronization signal $V_{sync}$ by a high-speed process and it is not necessary to transmit data, using a frame memory for one screen as the buffer memory 32. Further, it is possible to instantly perform rewriting of the pixel data after the screen refresh instruction by generating display data used for rewriting at a certain timing and transmitting the display data to the driver IC 3. As a result, when regions to be rewritten overlap in one display screen, for example, when a plurality of windows are to be rewritten, it is possible to avoid a phenomenon in which rewriting is momentarily seen and the display blinks (flickering).

As can be seen from the description of the operation of the process of rewriting the pixel data described above, rewriting of the display screen is performed not for each screen, but for each pixel row as a window (rectangular region) for a portion of the display screen. Partially performing the rewriting of the display screen is performed because the vertical drivers $221_A$ and $221_B$ are implemented using decoders and it is possible to appropriately select the pixel rows (lines) of the pixel array unit 21. Since the horizontal driver 231 is also implemented by a decoder, it is possible to partially perform rewriting of the display screen for each pixel.

Further, in the example of a process of rewriting display data, although the input command is determined and a writing instruction including the command (for example, a screen refresh command) is stored in the resistor 35 and then the control unit 36 receives the instruction and performs the process of rewriting the pixel data, this is just an example. As another configuration, for example, the control unit 36 may directly receive a writing instruction from the external controller 40 through the rewriting determination circuit 33 and the resistor 35.

The rewriting determination circuit 33 and the resistor 35 are not necessary since this configuration is employed and therefore it is possible to simplify the circuit configuration of the driver IC 3. That is, the rewriting determination circuit 33 and the resistor 35 are not necessary components of the driver IC 3.

Further, although the process of rewriting pixel data was described under the assumption of a reflective liquid crystal display in the above, a transmissive liquid crystal display or a semi-transmissive liquid crystal display may be applied to the rewriting process in the same way as the reflective liquid crystal display.

[1-4. Area Gradation Method]

The liquid crystal display 10 according to the embodiment employs an area gradation method to implement multi-bit colorization of pixel memories. In detail, an area gradation method is used that divides the pixel electrode that is the display area of a pixel 4 into a plurality of sub-pixel electrodes provided with weight according to area. Further, gradation display is performed by combination of the areas provided with weight, by transferring the pixel potential selected by the holding potential of the latch unit 24 to the sub-pixel electrodes provided with weight according to area.

Since the liquid crystal display 10 according to the embodiment is a reflective liquid crystal display, the sub-pixel electrodes provided with weight in area correspond to the reflective plates. Further, the sub-pixel electrodes provided with weight according to area correspond to transmissive windows.

The area gradation method is described in detail hereafter. The area gradation method is a gradation expression method that expresses $2^N$ gradations in N sub-pixel electrodes provided with weight, with area ratios of $2^0, 2^1, 2^2, \ldots 2^{N-1}$, and for example, employed for the purpose of reducing non-uniformity in image quality due to the difference in TFT characteristic. In the liquid crystal display 10 according to the embodiment, an area gradation method is adopted that expresses four gradations of 2 bits by providing weight for the area (pixel area) of the reflective electrode, which is the pixel electrode, at 2:1.

Figure 7A:
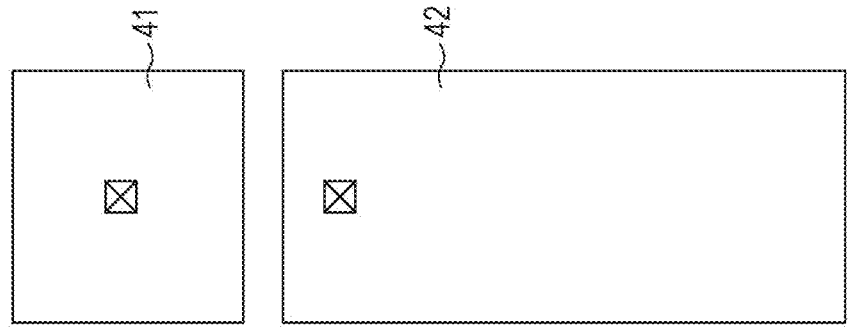
FIGS. 7A to 7C are illustrative diagrams of pixel division in an area gradation method.

As the structure in which the pixel area is provided with weight of 2:1, as shown in FIG. 7A, a structure in which the pixel electrode of a pixel 4 is divided into a sub-pixel electrode 41 having an area 1 and a sub-pixel electrode 42 having an area (area 2) double the area of the sub-pixel electrode 41 is typical. However, in the structure shown in FIG. 7A, the centers of the gradations are not aligned (do not agree with) the center of one pixel, which is disadvantageous in view of gradation expression.

Figure 7B:
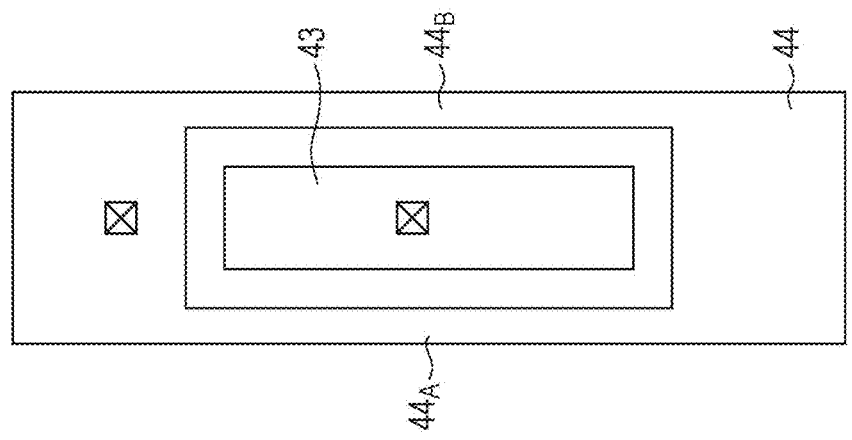

A structure in which the centers of gradations are aligned with the center of one pixel, as shown in FIG. 7B, there is a structure in which the center portion of the sub-pixel electrode 44 having the area 2 is cut off in a rectangular shape and the sub-pixel electrode 43 of the area 1 is disposed at the rectangular cut-off portion. However, in the structure of FIG. 7B, since the widths of connecting portions $44_A$ and $44_B$ of the sub-pixel electrode 44 which are positioned at both ends of the sub-pixel electrode 43 are small, the entire reflective area of the sub-pixel electrode 44 is reduced and along with this it is difficult to align the liquid crystals around the connecting portions $44_A$ and $44_B$.

As described above, in order to implement a VA (Vertical Aligned) mode with the liquid crystal molecules arranged substantially perpendicular to the substrate without an electric field in the area gradation, the voltage applied to the liquid crystal molecules is changed by the shape or size of the electrode, such that it is difficult to align the liquid crystals well. Further, since the area ratio of the reflective electrodes is not typically the reflection rate ratio, such that it is difficult to design gradation. The reflection rate is determined by the area or the liquid crystal alignment of the reflective electrode. In the structure of FIG. 7A, even if the area ratio is 1:2, the length ratio around the electrode does not become 1:2. Therefore, the area ratio of the reflective electrode is not typically the reflection rate ratio.

Figure 7C:
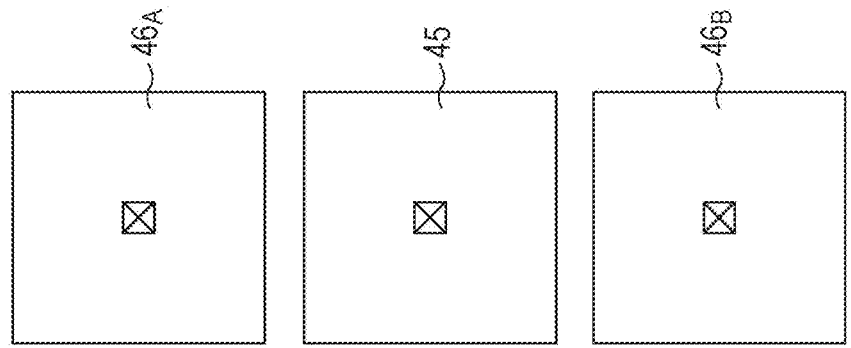

From this viewpoint, it is preferable to implement the pixel electrode with a three-division pixel in which the pixel electrode is divided into three sub-pixel electrodes 45, $46_A$, and $46_B$ having the same area, as shown in FIG. 7C, in the area gradation method. In the three-division pixels, it is possible to provide weight of 2:1 between the middle sub-pixel electrode 45 and the other sub-pixel electrode by making the two sub-pixel electrodes $46_A$ and $46_B$ above and under the middle sub-pixel electrode 45 a set and simultaneously driving the set of two sub-pixel electrodes $46_A$ and $46_B$. Further, it is possible to align the centers of the gradations with the center of one pixel.

However, when the three sub-pixel electrodes 45, $46_A$, and $46_B$ are electrically connected with a driving circuit, respectively, the contact numbers of the metal wires increase in comparison to the structure of FIGS. 7A and 7B, such that the pixel size increases, which interferes with achieving high accuracy. In particular, in the MIP pixel configuration in which each pixel 4 has a memory, as seen from FIG. 5, many circuit components, such as transistors, or contact portions exist in one pixel 4, such that there is no room in the layout area and one contact portion greatly influences the pixel size.

Figure 8:
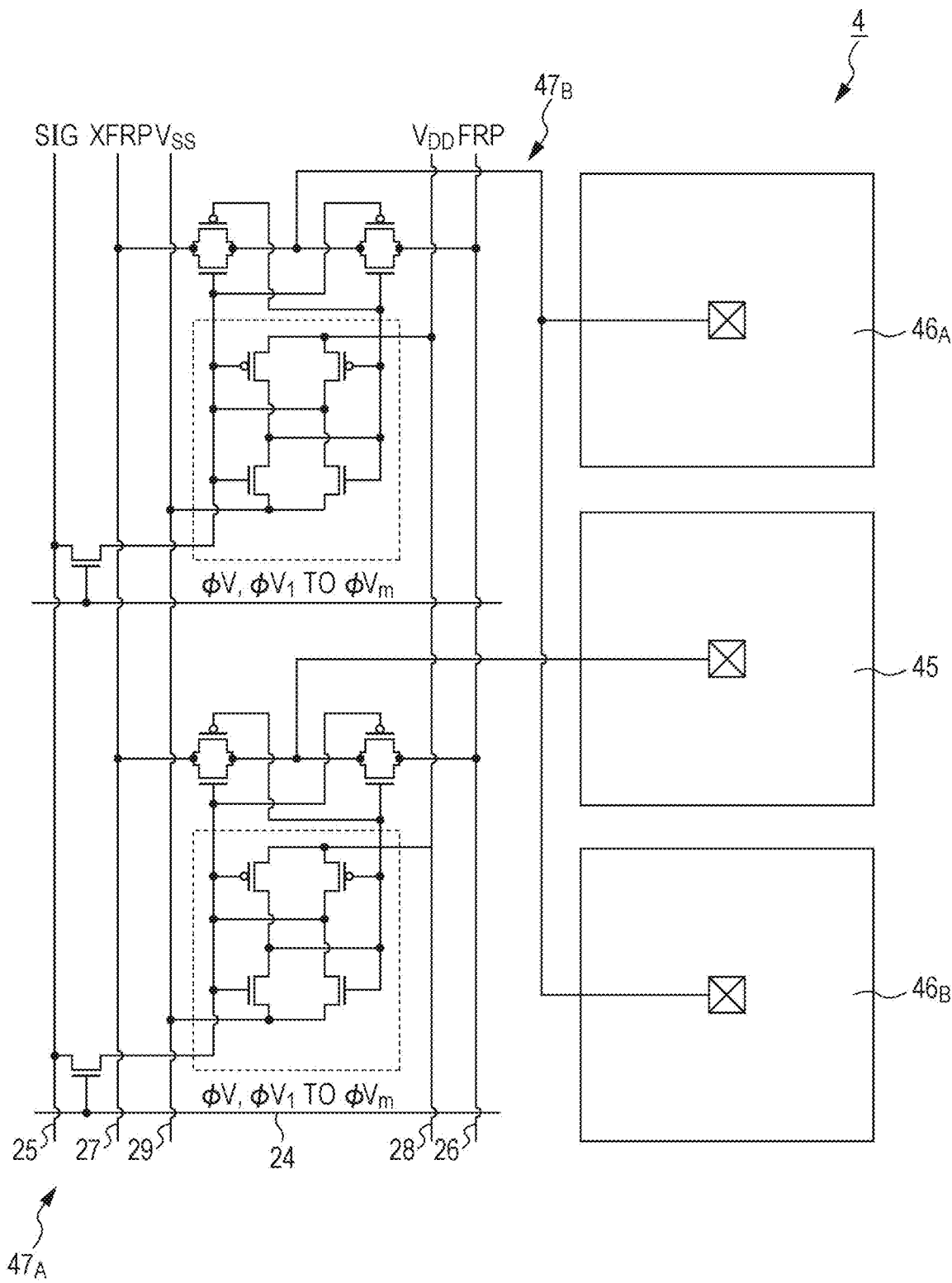
FIG. 8 is a circuit diagram showing correspondence relationship between three sub-pixel electrodes and two sets of driving circuits in a three-division pixel structure.

A pixel structure which electrically combines (connect) two sub-pixel electrodes $46_A$ and $46_B$ disposed at a predetermined distance with one sub-pixel electrode 45 therebetween is preferable to reduce the contact number. Further, as shown in FIG. 8, one sub-pixel electrode 45 in one set of driving circuits $47_A$ is driven and the remaining two sub-pixel electrodes $46_A$ and $46_B$ in another set of driving circuits $47_B$ are simultaneously driven. The driving circuits $47_A$ and $47_B$ correspond to the pixel circuits shown in FIG. 5.

As described above, in a pixel structure in which the centers of the gradations are aligned with respect to the center of one pixel by using the area gradation method, the pixel structure in which two sub-pixel electrodes $46_A$ and $46_B$ spaced apart are electrically connected is employed to reduce the contact number. Further, the following two methods may be considered as the method of electrically combining two sub-pixel electrodes $46_A$ and $46_B$.

One method is a method of connecting the two sub-pixel electrodes $46_A$ and $46_B$ on a planarizing film through a contact portion formed in the planarizing film by using a metal wire formed under the planarizing film. Another method is a method of electrically connecting two sub-pixel electrodes $46_A$ and $46_B$ on a planarizing film in the same plane.

In those methods, since it is necessary to make the film thickness of the planarizing film larger in order to further ensure the operation and effect of planarization of the planarizing film, it is necessary to form a contact seat in a predetermined size in order to form a contact portion including a contact hole in the planarizing film. Therefore, it is necessary in the former method to form a contact seat in a predetermined size, but the pixel size increases, such that it becomes a factor that deteriorates high accuracy.

Meanwhile, it is necessary in the latter method to connect the two sub-pixel electrodes $46_A$ and $46_B$ with ITO (Indium Tin Oxide) and another conductor, such that the available display area (reflective area in the reflective liquid crystal display) reduces. Further, in the VA mode, since alignment control is difficult and the area ratio of the reflective electrodes is not typically the reflection rate ratio, the gradation design is difficult.

[1-5. Pixel Structure According to Embodiment]

In the embodiment, the following pixel structure is exemplified when a pixel employing the area gradation method is implemented, for example, in a three-division pixel structure.

In general, a planarizing film for planarization is formed on a substrate where a circuit unit (that is, the TFT circuit unit 2 shown in FIG. 2) is formed. The planarizing film has a two-layer structure with first and second planarizing films sequentially structured in the embodiment. Further, a metal wire is formed in the two-layer planarizing film, that is, between the first and second planarizing films. Further, a pixel structure in which two electrodes (sub-pixel electrodes $46_A$ and $46_B$) spaced apart on the second planarizing film are electrically connected by the metal wire.

In the pixel structure having this configuration, it is possible to make the film thicknesses of the first and second planarizing films relatively smaller than the film thickness of a single-layer planarizing film by implementing the planarizing film in the two-layer structure. Further, two planarizing electrodes (sub-pixel electrodes $46_A$ and $46_B$) spaced apart on the second planarizing film are electrically connected through the second planarizing film by the metal wire between the first and second planarizing films.

In this configuration, since the film thickness of the second planarizing film is small, it is possible to make the contact seat when forming a contact portion for electric connection in the second planarizing film smaller than when forming a contact portion in a single-layer planarizing film. Therefore, it is possible to make the pixel size smaller than when forming a contact portion in a planarizing film having a single-layer structure even if employing the structure in which a metal wire is formed in two-layer planarizing film and two electrodes are electrically connected through the second planarizing film by the metal wire.

Accordingly, it is possible to provide a pixel structure that does not interfere with implementing high accuracy for a display by employing the pixel structure. Further, since the metal wire electrically connecting two electrodes (sub-pixel electrodes $46_A$ and $46_B$) is disposed between the two planarizing films of the two-layer structure, the available display area (reflective area) is not reduced in a reflective liquid crystal display, unlike when a metal wire is disposed in the same plane as two electrodes.

A detailed embodiment of a pixel structure according to the embodiment, that is, a pixel structure, for example, having three-division pixels employing the area gradation method, without interfering with implementing high accuracy of a display is described hereafter.

(Embodiment 1)

FIGS. 9A and 9B are illustrative views of the pixel structure according to a first embodiment of the three-division pixel employing the area gradation method, in which FIG. 9A is a plan view showing three sub-pixel electrodes and FIG. 9B is a cross-sectional view taken along the line IXB-IXB of FIG. 9A. In FIGS. 9A and 9B, the same portions as those in FIGS. 7 and 8 are given the same reference numerals. In this embodiment, the substrate of the TFT circuit unit 2 and the TFT circuit formed on the substrate are not shown.

In FIGS. 9A and 9B, a planarizing film is formed in a two-layer structure by forming a first planarizing film 51 and a second planarizing film 52 for planarizing the entire substrate on the substrate (not shown) where a TFT circuit is formed. By forming the planarizing film in a two-layer structure, it is possible to make the film thicknesses of the first and second planarizing films 51 and 52 relatively smaller than the film thickness of a single-layer planarizing film.

A metal wire 53 is formed by ITO (Indium Tin Oxide) or another conductive material in the two-layer planarizing film, that is, between the first and second planarizing films 51 and 52. As another conductive material, aluminum (Al), silver (Ag), molybdenum (Mo) or the like may be used.

In this configuration, although ITO that can take silver (Ag) having high reflection ratio and ohmic contact in various wire materials that are used for the metal wire 53 is used, metal other than ITO may be selected by the kinds of metal that are used for a pixel electrode.

Further, three sub-pixel electrodes 45, $46_A$, and $46_B$ are formed as reflective electrodes by silver (Ag) or aluminum (Al) on the second planarizing film 52. The three sub-pixel electrodes 45, $46_A$, and $46_B$ are the same in size (reflective area). Further, it is possible to provide weight of 2:1 between a middle sub-pixel electrode 45 and the other sub-pixel electrode by making the two sub-pixel electrodes $46_A$ and $46_B$ above and under the middle sub-pixel electrode 45 a set and simultaneously driving the set of two sub-pixel electrodes $46_A$ and $46_B$.

The first planarizing film 51 has a contact portion 55 including a contact hole $55_A$ formed in the planarizing film 51. The contact portion 55 is formed at a position deviated from the center position of the sub-pixel electrode $46_A$.

The wire material of the metal wire 53 forms the contact portion 55 together with the contact hole $55_A$ by forming a conductive layer in the contact hole $55_A$. Further, the metal wire 53 is electrically connected with the TFT circuit unit 2, in detail, the driving circuit $47_B$, as shown in FIG. 8, through the contact portion 55.

The second planarizing film 52 has contact portions 56 and 57 respectively including the contact holes $56_A$ and $57_A$ formed at the portions corresponding to, for example, the center positions of the sub-pixel electrodes $46_A$ and $46_B$ of the planarizing film 52. In this configuration, since the contact portions 56 and 57 are disposed to be deviated from the contact hole 55 of the first planarizing film 51, the film thickness of the second planarizing film 52 is smaller than the film thickness of a planarizing film having a single-layer structure, such that the diameters of the contact holes $56_A$ and $57_A$ may be made smaller than the diameter of the contact hole formed in a planarizing film having a single-layer structure.

The electrode materials of the sub-pixel electrodes $46_A$ and $46_B$ form the contact portions 56 and 57 together with the contact holes $56_A$ and $57_A$ by conductive layers in the contact holes $56_A$ and $57_A$. Further, the sub-pixel electrode $46_A$ and $46_B$ are electrically connected with the metal wire 53 through the contact portions 56 and 57.

In the first and second planarizing films 51 and 52 of the two-layer structure, the contact portion 56 of the sub-pixel electrode $46_A$ is formed at the portion corresponding to the center position of the sub-pixel electrode $46_A$ while the contact portion 55 of the first planarizing film 51 is formed at the position deviated from the center position of the sub-pixel electrode $46_A$. That is, the contact portion 55 of the lower first planarizing film 51 and the contact portion 56 of the upper second planarizing film 52 are disposed at different positions when seen from above.

This means that it is possible to dispose the contact portion 55 of the first planarizing film 51 regardless of the position of the contact portion 56 of the second planarizing film 52 because the metal wire 53 exists between the contact portion 55 and the contact portion 56. Accordingly, the degree of freedom in respect to the circuit unit connected to the contact portion 55, in detail, the sub-pixel electrode $46_A$ and $46_B$ of the driving circuit $47_B$ shown in FIG. 8 increases. This is the same in the relationship between a contact portion 59 and a contact portion 60 of the sub-pixel electrode 45.

In the pixel structure according to the first embodiment having the configuration, the sub-pixel electrodes $46_A$ and $46_B$ are electrically connected through the contact portions 56 and 57 while the sub-pixel electrodes $46_A$ and $46_B$ are electrically connected with the driving circuit $47_B$ through the contact portion 55, by the metal wire 53.

Although the sub-pixel electrodes $46_A$ and $46_B$ were described, the sub-pixel electrode 45 is as follows. That is, as shown in FIG. 9A, the sub-pixel electrode 45 and the driving circuit $47_A$ shown in FIG. 8 are electrically connected through the contact portions 59 and 60 formed in the first and second planarizing films 51 and 52 by the metal wire 58 formed between the planarizing films 51 and 52 having the two-layer structure.

As described above, according to the pixel structure of the first embodiment, it is possible to make the film thicknesses of the first and second planarizing films 51 and 52 smaller than the film thickness of a planarizing film having a single-layer structure by making the planarizing film in the two-layer structure. Further, it is possible to electrically connect the two sub-pixel electrodes $46_A$ and $46_B$ on the second planarizing film 52 to the metal wire 53 between the planarizing films 51 and 52.

The sub-pixel electrodes $46_A$ and $46_B$ also can be connected with more than two wires as shown in FIG. 9C. In this layout, the two sub-pixel electrodes $46_A$ and $46_B$ are electrically connected in two ways, which are placed in the both sides of the contact portions 59 and 60. This layout can reduce a defect of a pixel because of breaking of the metal wire 53, which is likely to be caused by, for example, impure dust mixed during a process or strain of the planarizing film 51 or 52. This means even if one side of the wire is broken, the sub-pixel electrodes $46_A$ and $46_B$ can be still in electrically contact each other by the other side of the wire 53.

In this configuration, since the contact portions 56 and 57 are disposed to be deviated from the contact hole 55 of the first planarizing film 51, the thicknesses of the contact portions can be made large. Accordingly, in the electric contact by the metal wire 53, it is possible to make the diameters of the contact holes $56_A$ and $57_A$ small when forming the contact portions 56 and 57 in the second planarizing film 52. Therefore, the sizes of the contact portions 56 and 57 are made small, such that the pixel size does not increase.

In the pixel structure according to the first embodiment, as the pixel electrode of one pixel 4 is divided in to three sub-pixel electrodes 45, $46_A$, and $46_B$, four gradations are expressed in 2 bits by providing weight of 2:1 to the pixel area, by simultaneously driving a set of the upper and lower two sub-pixel electrodes $46_A$ and $46_B$. In the pixel structure of the three-division pixel employing the area gradation method, the positions of the centers of the higher and lower bits, that is, the positions of the display centers by the sub-pixel electrodes $46_A$ and $46_B$ and the position of the display center by the sub-pixel electrode 45 are aligned (meet).

As described above, in the pixel structure employing the area gradation method, when the center positions of the bits are aligned, it is possible to express gradation better than a pixel structure in which they are not aligned. In this embodiment, although it was described the pixel electrode with three-division pixels as an example, it is not limited to the pixel electrode with three-division pixels. That is, it is possible to implement better gradation when the center positions of bits are aligned, even in a pixel structure having four division pixels.

(Embodiment 2)

As stated above, since voltage that is applied to the liquid crystal molecules is changed by the electrode shape or the electrode size when the VA (vertical alignment) mode is implemented by the area gradation method, it is difficult to align the liquid crystal well. Further, since the area ratio of the sub-pixel electrodes (reflective electrodes) is not the reflection rate ratio, such that it is difficult to design gradation. The pixel electrode according to the second embodiment which is described hereafter is made in consideration of the fact.

FIGS. 10A and 10B are illustrative views of a pixel structure according to the second embodiment of a three-division pixel employing the area gradation method, in which the same portions as those of FIGS. 9A and 9B are given the same reference numerals. FIG. 10A is a plan view showing three sub-pixel electrodes and FIG. 10B is a cross-sectional view taken along the line XB-XB of FIG. 10A.

The pixel structure according to the second embodiment is basically the same as the pixel electrode according to the first embodiment, in the configuration where the two sub-pixel electrodes $46_A$ and $46_B$ are electrically connected. That is, the pixel structure according to the second embodiment has the configuration in which a planarizing film is formed in a two-layer structure, a metal wire 53 is formed between first and second planarizing films 51 and 52 of the two-layer structure, and the two sub-pixel electrodes $46_A$ and $46_B$ on the second planarizing film 52 are electrically connected by the metal wire 53.

In addition to this configuration, the pixel structure according to the second embodiment includes alignment factors 61, 62, and 63 for controlling vertical alignment. The alignment factors 61, 62, and 63 are one of the alignment control units which are commonly called VAPs (Vertical Alignment Protrusion), and determine the direction in which liquid crystal molecules fall down when an electric field is applied, that is, cause the liquid crystal molecules to fall down in a predetermined direction.

The alignment factors 61, 62, and 63, that is the VAPs 61, 62, and 63 are disposed at the center portions of the middle sub-pixel electrode 45 and two sub-pixel electrodes $46_A$ and $46_B$, respectively. Meanwhile, the second planarizing film 52 has a contact portion 60 at the portion corresponding to the center position of the middle sub-pixel electrode 45 while having contact portions 56 and 57 at the portions corresponding to the center position of the two sub-pixel electrodes $46_A$ and $46_B$.

That is, the disposed positions of the VAPs 61, 62, and 63 and the disposed positions of the contact portions 60, 56, and 57 agree with each other. In other words, in the pixel structure according to the second embodiment, the contact portions 60, 56, and 57 disposed in the second planarizing film 52 are used (also used) as the VAPs 61, 62, and 63.

As described above, in the pixel structure according to the second embodiment, when the VA mode is implemented by the area gradation method, the VAPs 61, 62, and 63 are disposed at the center portions of the middle sub-pixel electrode 45 and the two sub-pixel electrodes 46$_A$ and 46$_B$ therebetween. By adopting this configuration, in addition to the operation and effect of the pixel structure according to the first embodiment, the following operation and effect can be obtained.

Since the electrode shapes of the three division sub-pixel electrodes 45, 46$_A$, and 46$_B$ are the same and the distribution of electric fields is uniform in the sub-pixel electrodes 45, 46$_A$, and 46$_B$, when the electric field is applied, the liquid crystal molecules can be caused to fall down in a predetermined direction by operations of the VAPs 61, 62, and 63. As a result, it is possible to align the liquid crystal well. Further, since the contact portions 60, 56, and 57 are also used as the VAPs 61, 62, and 63, there is an advantage in that it is not necessary to specifically provide the VAPs 61, 62, and 63.

However, the VAPs 61, 62, and 63 are not limited to the configuration in which those are also used as the contact portions 60, 56, and 57, and may be other configurations, for example, a configuration in which holes are formed in metal wires 53 and 58 and the holes are used as the VAPs 61, 62, and 63. Further, a consideration in which protrusions are disposed as the VAPs 61, 62, and 63 may be considered. It is preferable in any case that the VAPs 61, 62, and 63 be positioned at the center portions of the three sub-pixel electrodes 45, 46$_A$, and 46$_B$, respectively.

In the second embodiment, the sub-pixel electrodes 46$_A$ and 46$_B$ also can be connected with more than two wires as shown in FIG. 10C, as described in the first embodiment.

In the pixel electrode according to the embodiment described above, although it was exemplified that it is applied to a liquid crystal display in which the pixels are pixels (MIP pixel) with built-in memories, it may not be limited to the application example. That is, it does not matter whether the pixels have the MIP pixel structure. However, in the MIP pixel structure, since a plurality of circuit components, such as transistors, or contact holes are in one pixel, the circuit density is high, such that there is no room for the layout in area. Therefore, considering high accuracy, the pixel structure according to the embodiment can achieve a sufficient operation and effect by being applied to a liquid crystal display having the MIP pixel structure because the contact number or the number of wires is not increased.

Further, whether the applied liquid crystal display has the pixel structure employing the area gradation method or not does not matter in terms of the technical items that the planarizing film is formed in a two-layer structure, the metal wire is formed between the two planarizing films of the two-layer structure, and the two electrodes disposed on the upper planarizing film are electrically connected by the metal wire. That is, the present disclosure can be generally applied to liquid crystal display employing the configuration in which two electrodes disposed on a planarizing film are electrically connected.

[1-6. Specular Reflection]

The sub-pixel electrode 45, 46$_A$, and 46$_B$, which are reflective plates (reflective electrodes), implement specular reflection, in a reflective liquid crystal display, preferably, a reflective liquid crystal display using a front dispersing film (photochromatic film). However, in a common liquid crystal display, a planarizing film is formed on the uneven surface of the wire of formed as the driving circuit, that is, particularly the pixel array unit 21 of the TFT circuit unit 2 of FIG. 2, and a reflective electrode is formed thereon.

Therefore, remaining surface roughness due to unevenness of the wire of the circuit.

unevenness due to the wire under the reflective electrode.

tapered region around the pixel electrode and the contact portion.

an the like become dispersion factors and deteriorate the reflective ratio and contrast.

Figure 11:
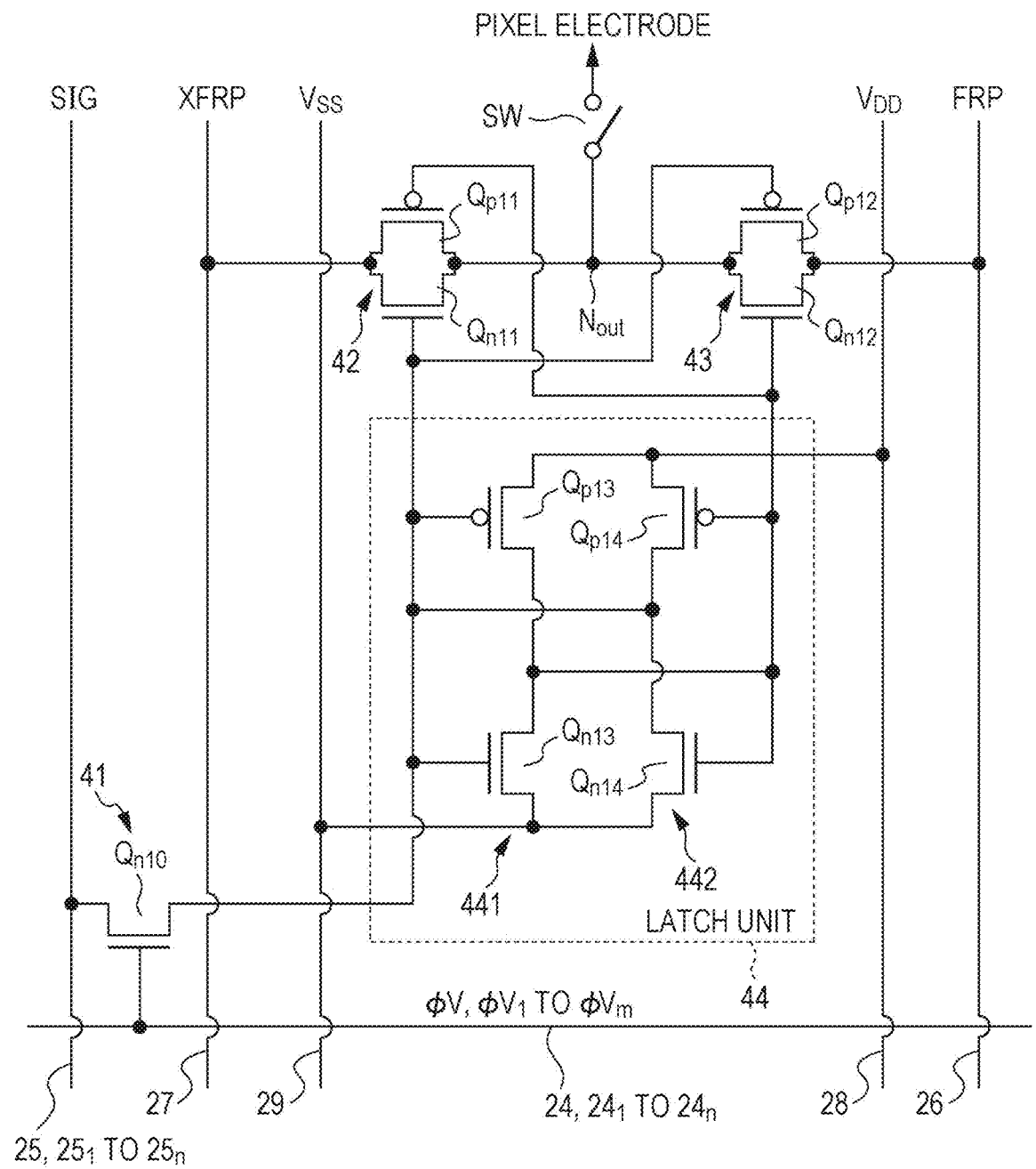
FIG. 11 is an illustrative view of a switch element selectively supplying power to a pixel electrode.

Further, when the area gradation is applied, a switch element SW selectively supplying power to the pixel electrodes is necessary to dispose sub-pixels without a limit, as shown in FIG. 11. A transistor, for example, a thin film transistor TFT may be used as the switch element SW. Further, as switch element SW increases in each pixel 4, the circuit density of the pixel array unit 21 increases proportionately.

[1-7. Pixel Array Substrate Structure According to Embodiment]

In the embodiment, in a reflective liquid crystal display, when the area gradation is applied, the structure of a pixel array substrate (TFT array substrate) is implemented by the following structure.

That is, first, on a substrate where a circuit unit, that is the TFT circuit unit 2 is formed, a planarizing film for planarizing the pixel array substrate structure is formed in a two-layer structure by sequentially stacking first and second planarizing films (corresponding to the planarizing films 51 and 52 of FIGS. 9A and 9B). Further, a relay wire is formed between the first and second planarizing films of the two-layer structure. Further, a first contact portion connected to the TFT circuit unit 2, which is formed in the first planarizing film, and a second contact portion formed at a position, which is different from the first contact portion when seen from above, of the second planarizing film are electrically connected by the relay wire.

In the pixel array substrate having this configuration, since the planarizing film formed in the substrate has the two-layer structure, it is possible to more reliably reduce the surface roughness due to the unevenness of the wire of the circuit in comparison to a planarizing film having a single-layer structure. Further, since the relay wire is disposed between the first contact portion and the second contact portion, even if the circuit density of the TFT circuit unit 2 where the first contact portion is connected increases, the disposed position of the second contact portion is not restricted by the circuit pattern. In other words, it is possible to implement free layout of the second contact portion formed in the second planarizing film, that is, it is possible to appropriately set the disposed position of the second contact portion with respect to the disposed position of the first contact portion.

As described above, since it is possible to more reliably remove the surface roughness due to the unevenness of the wire of the circuit and it is possible to implement free layout of the second contact portion formed in the second planarizing film without influencing the image grad, it is possible to provide a reflective liquid crystal display having a high display quality. An example of the pixel array substrate structure according to the embodiment is described hereafter in detail with reference to the drawings.

(Substrate Structure)

Figure 12:
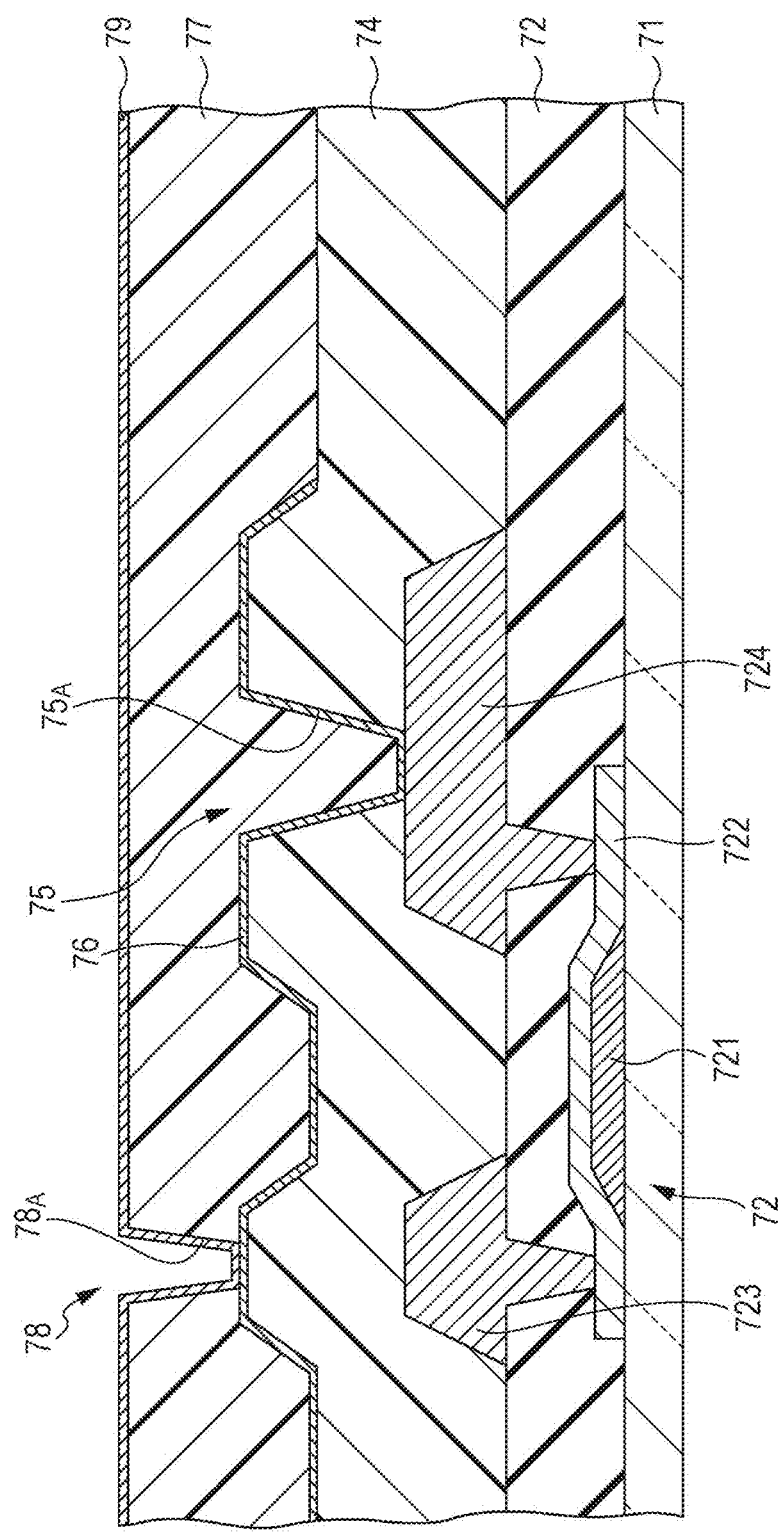
FIG. 12 is a cross-sectional view of the main parts showing an example of a detailed structure of a pixel array substrate structure according to an embodiment.

FIG. 12 is a cross-sectional view of the main parts showing an example of a detailed structure of a pixel array substrate structure according to an embodiment.

In FIG. 12, a circuit unit including a transistor 72 is formed on the surface of a transparent substrate (base material) 71. For example, a glass substrate is used as the transparent substrate 71. For example, a TFT (Thin Film Transistor) is used as the transistor 72. That is, the circuit unit including the transistor 72 corresponds to the TFT circuit unit 2 of FIGS. 1 and 2. In the transparent substrate 71, a plurality of array-shaped pixel regions is disposed and the transistor 72 is formed in each pixel 4.

The transistor 72 exemplified in the embodiment functions as a switch element that controls power supply to pixel electrodes disposed in each pixel 4. That is, the transistor 72 corresponds to the switch element SW of FIG. 11. Though not shown in FIG. 12, the transistor of the pixel circuit (driving circuit) having a memory function shown in FIG. 5 is also included in the TFT circuit unit 2 formed on the transparent substrate 71.

The transistor (TFT) 72 has a configuration in which a gate electrode 721 is formed on the transparent substrate 71 and a semiconductor layer 722 having an active layer configuration is formed thereon. In the semiconductor layer 722, the center portion is a channel region and both ends are source/drain areas. In both source/drain regions of the semiconductor layer 722, source/drain electrodes 723 and 724 made of conductive materials, such as aluminum (Al) or titanium (Ti), are electrically connected through an insulating film.

In the transparent substrate 71 in which the TFT circuit unit 2 including the transistor 72 is formed, the upper surface is uneven by a metal wire including the source/drain electrodes 723 and 724. A first planarizing film 74 is formed, covering the TFT circuit unit 2 including the transistor 72, to remove the unevenness. The first planarizing film 74 corresponds to the first planarizing film 51 of FIGS. 9A and 9B. A contact hole $75_A$ is formed in the first planarizing film 74.

A conductive thin film, for example, made of ITO is formed and a relay wire 76 is formed by implementing a desired circuit pattern by photolithography, on the first planarizing film 74. ITO for making the relay wire 76 is also formed on the inner wall of the contact hole $75_A$ formed in the first planarizing film 74, such that a first contact portion 75 that electrically connects the relay wire 76 with the transistor 72 is formed.

A second planarizing film 77 that covers the relay wire 76 that is a circuit pattern is formed on the first planarizing film 74. The second planarizing film 77 corresponds to the second planarizing film 52 of FIGS. 9A and 9B. A contact hole $78_A$ is formed in the second planarizing film 77. The contact hole $78_A$ is disposed in a layout at different position from the contact portion $75_A$ formed in the first planarizing film 74 when seen from above.

A thin conductive film having a high reflection ratio, which is made of silver (Ag) or aluminum (Al), is formed on the second planarizing film 77 and a pixel electrode 79 is formed as a reflective electrode by implementing a desired pixel electrode pattern by photolithography, on the second planarizing film 77. The pixel electrode 79 correspond to the sub-pixel electrode 45 and the sub-pixel electrodes $46_A$ and $46_B$ of FIGS. 9A and 9B.

For example, Ag for making the pixel electrode 79 is also formed on the inner wall of the contact hole $78_A$ formed in the second planarizing film 77, such that a second contact portion 78 that electrically connects the relay wire 76 with the pixel electrode 79 is formed. Since the contact hole $78_A$ is disposed in layout at a position different from the contact hole $75_A$ when seen from above, obviously, the second contact portion 78 is also disposed in layout at a position different from the first contact portion 75 when seen from above.

In this configuration, the second contact portion 78 formed in the second planarizing film 77 becomes a dispersion reflection region, that is, an optically unavailable region, thereby influencing the image grade. Accordingly, the size and the layout position of the second contact portion 78 become important in achieving a high display grade for the liquid crystal display.

As described above, in the pixel array substrate structure according to the embodiment, the planarizing film formed on the transparent substrate 71 for the purpose of planarizing the substrate surface is formed in a two-layer structure by sequentially stacking the first and second planarizing films 74 and 77. According to the two-layer structure, it is possible to more reliably remove roughness of the circuit, that is, the surface roughness due to unevenness of the wire, as compared with a planarizing film having a single-layer structure, and it is also possible to remove the step of the relay wire 76 by using the second planarizing film 77.

In this configuration, the fact that it is possible to further planarize the substrate surface means that it is possible to form a pixel electrode 79 having higher flatness, as a reflective electrode. Further, since it is possible to form the pixel electrode 79 having higher flatness, as a reflective electrode, it is possible to achieve a high reflection ratio and contrast as a reflective liquid crystal display, as compared with the related art using a planarizing film having a single-layer structure.

Figure 13A:
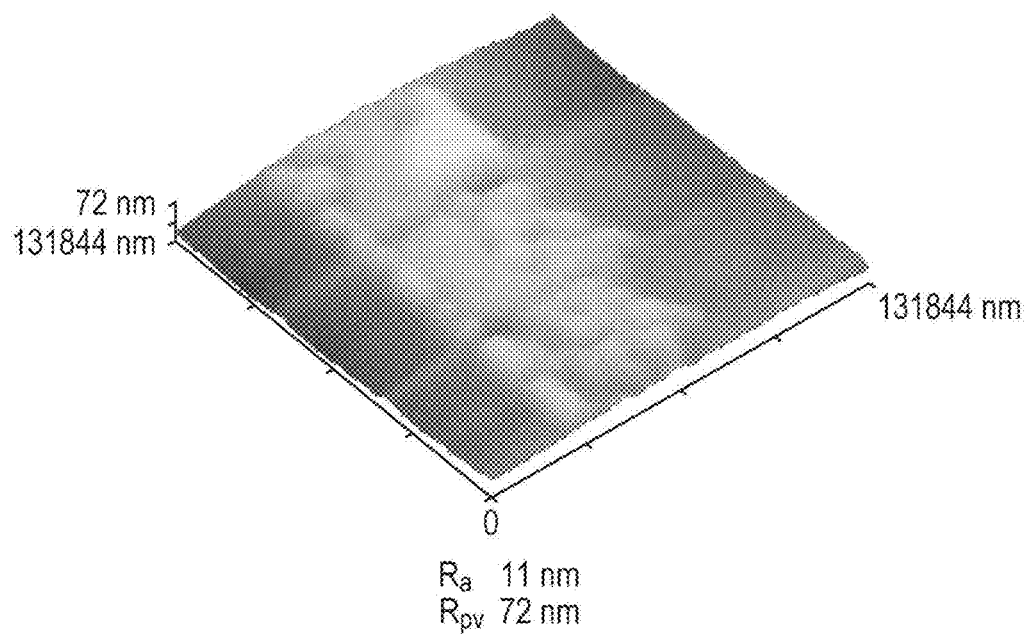
FIGS. 13A and 13B are comparative views of a case of FIG. 13A with two layers of planarizing films and a case FIG. 13B with one layer of planarizing film, for roughness of a substrate surface, when planarizing films are formed on a TFT substrate having a pixel structure with a built-in memory and then a pixel electrode is formed thereon.
Figure 13B:
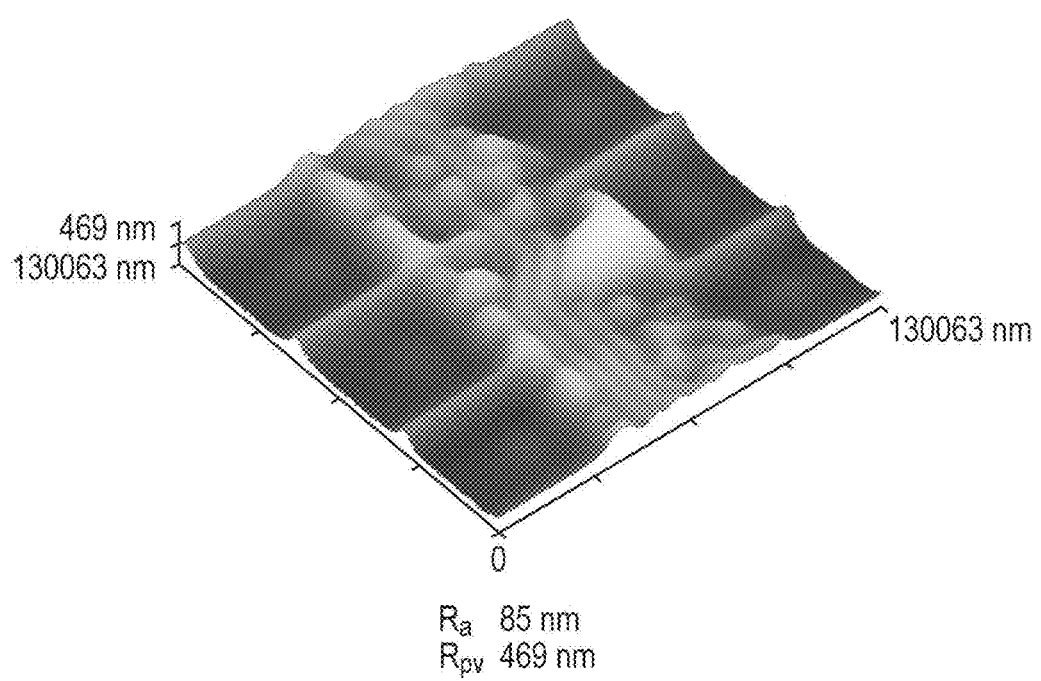

FIGS. 13A and 13B are comparative views of a case of FIG. 13A with two layers of planarization films and a case FIG. 13B with one layer of planarization film, for asperity of a substrate surface, when planarization films are formed on a TFT substrate having a pixel structure with a built-in memory and then a pixel electrode is formed thereon. A result of measuring surface roughness with an AFM (Atomic Force Microscope), without forming a contact hole for comparison with planarization effect, is shown.

In FIGS. 13A and 13B, $R_a$ is variation (surface degree of a surface) and Rpv is a height difference (height difference of tip and valley). As shown in FIG. 13A, the outer shape of the substrate surface is substantially a shiny surface when the planarizing film has a two-layer structure. On the other hand, as shown in FIG. 13B, the substrate surface is rough, when the planarizing film has a single-layer structure.

Further, since the first and second contact portions 75 and 78 are disposed in layout at different positions and are connected by the relay wire 76, the TFT circuit unit 2 is not complicated even if the relay wire 76 depends on the positional relationship of the contact portions 75 and 78.

On the other hand, when the planarizing film is formed in a single layer, when the wire under the planarizing film depends on the positional relationship of the layout of the contact portions connected to the pixel electrode, the TFT circuit unit 2 is complicated because the wire is the wire of the TFT circuit unit 2.

Further, since the first and second contact portions 75 and 78 are connected by the relay wire 76, the position of the second contact portion 78 in the layout is not restricted by the circuit pattern, even if the circuit density of the TFT circuit 2 increases. In other words, it is possible to implement free layout of the second contact portion 78 formed in the second planarizing film 77 and influencing the image grade such that the influence on the image grade is small, that is, it is possible to appropriately set the disposed position of the second contact portion 78 with respect to the disposed position of the first contact portion 75.

Further, by forming the planarizing film in a two-layer structure, it is possible to make the film thicknesses of the first and second planarizing films 74 and 77 relatively smaller than the planarizing formed in a single-layer structure. Therefore, it is possible to reduce the diameters of the contact holes $75_A$ and $78_A$ formed in the first and second planarizing films 74 and 77. In particular, since it is possible to reduce the diameter of the contact hole $78_A$ formed in the second planarizing film 77, it is possible to suppress the influence on the image grade as small as possible while it is possible to increase the operation and the effect of the relay wire 76 and achieve free layout of one or more small-sized contact portions in the second planarizing film 77.

As described above, according to the pixel array substrate structure of the embodiment, it is possible to reliably remove the surface roughness due to the unevenness of the wire of the circuit while it is possible to make the second contact portion 78 a small size in the second planarizing film 77 in a free layout without influencing the image grade. As a result, according to the pixel array substrate structure of the embodiment it is possible to provide a reflective liquid display having high display grade.

Further, although the planarizing film has the two-layer structure, since the relay wire 76 is not disposed between the two-layer planarizing films 74 and 77 in the related art (Japanese Unexamined Patent Application Publication No. 2001-284342) in which the contact portions are formed at the same positions of the first layer and the second layer when seen from above in the planarizing film having upper and lower two layers, there is the following problems.

That is, since the two contact portions 75 and 78 are formed at the same position when seen from above, the aperture ratio of the pixel is reduced by the alignment deviation of the contact portions 75 and 78. Further, since the disposed position of the second contact portion 78 is restricted by the circuit pattern of the TFT circuit unit 2 in which the first contact portion 75 is connected, it is difficult to implement the second contact portion 78 with free layout.

On the other hand, according to the pixel array substrate structure of the embodiment, since the two contact portions 75 and 78 are electrically connected by the relay wire 76 disposed between the planarizing films 74 and 77, the aperture ratio of the pixel is not reduced by the alignment deviation of the contact portions 75 and 78.

Further, since it is possible to freely set the positions of the first and second contact portions 75 and 78 by interposing the relay wire 76, without being influenced by the circuit pattern of the TFT circuit unit 2, it is possible to reduce the circuit density of the TFT circuit unit 2 even if the pixel electrode is divided by the area gradation method.

(Method of Manufacturing)

Figure 14:
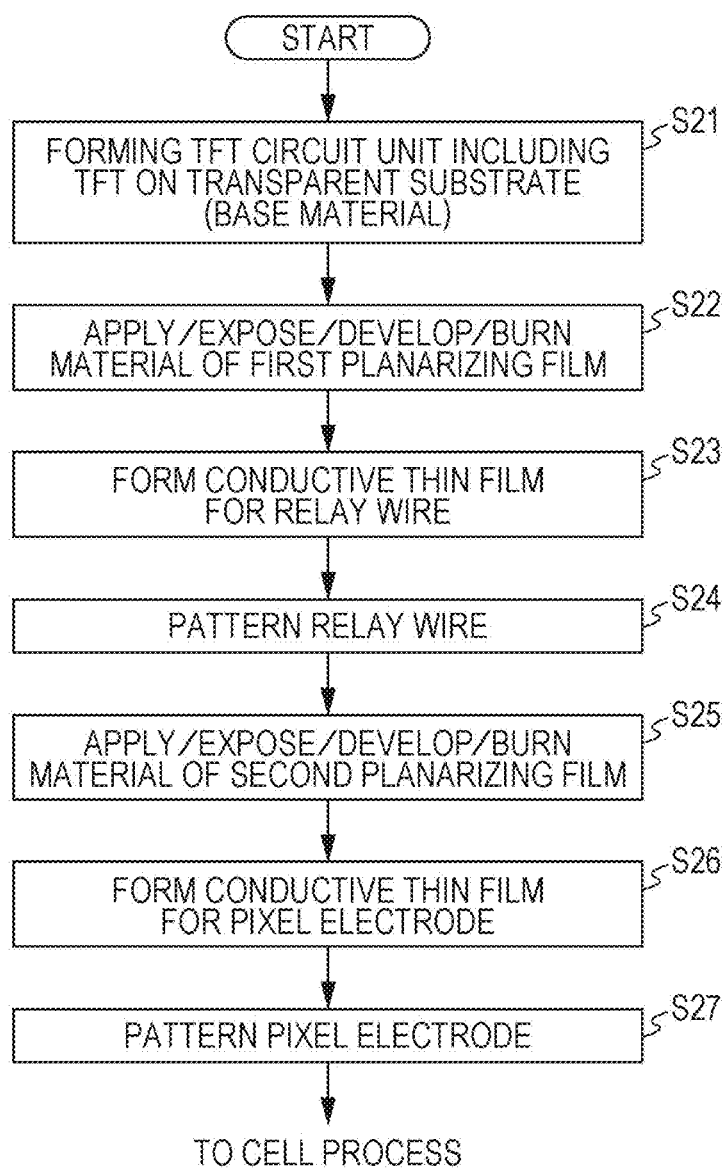
FIG. 14 is a flowchart showing the flow of processes of a method of manufacturing a pixel array substrate structure according to an embodiment.

Next, the method of manufacturing the pixel array substrate structure according to the embodiment is described with reference to the flowchart of FIG. 14.

First, the TFT circuit unit 2 including the transistor (TFT) 72 is formed on the transparent substrate (base material) 71 (Step S21). Next, the first planarizing film 74 is formed by applying, exposing, developing, and burning at a high temperature the material of the first planarizing film 74 (Step S22).

Figure 15B:
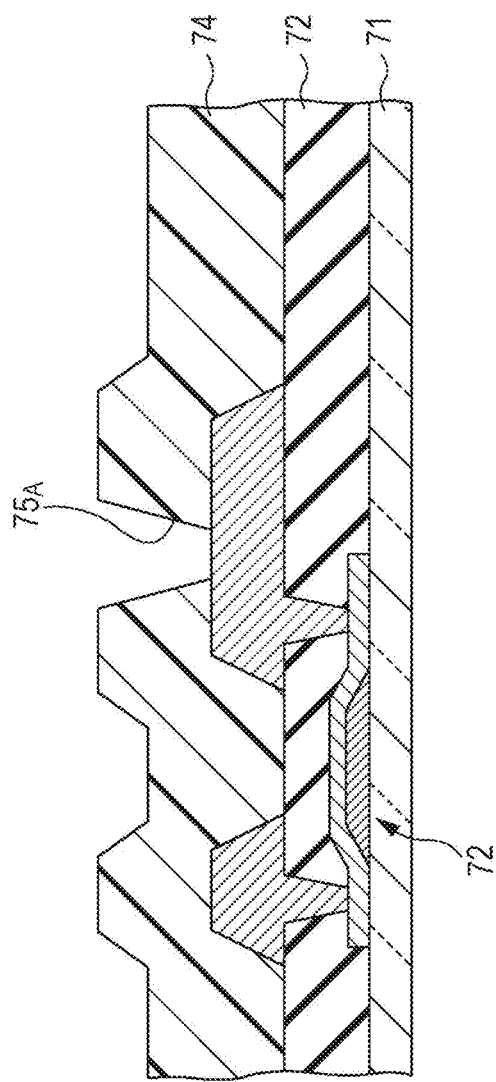
Figure 15A:
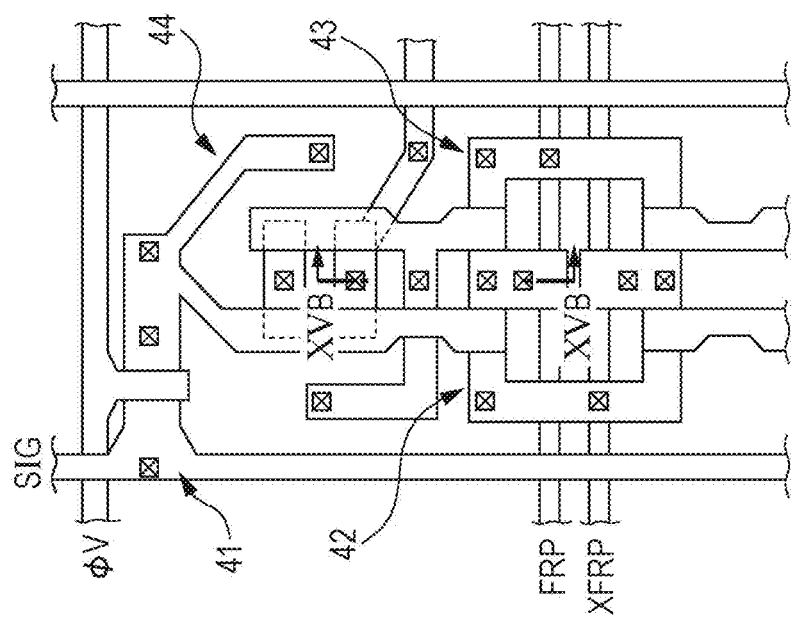

FIG. 15A is a plan pattern view schematically showing a plan pattern of a pixel circuit when a first-layer planarizing film (first planarizing film) 74 is formed and FIG. 15B is a cross-sectional view taken along the line XVB-XVB of the plan pattern view FIG. 15A.

The plan pattern view of FIG. 15A is a pattern view corresponding to a circuit configuration using two pixel circuits (driving circuits) ($47_A$ and $47_B$) with a built-in memory shown in FIG. 5, for three sub-pixel electrodes 45, $46_A$, and $46_B$, as shown in FIG. 8. In the relationship with the circuit configuration of FIG. 5, in the pixel 4 with a built-in memory, the switch elements 41 to 43 and the latch unit 44 are implemented by using a transistor, in detail, a TFT. This exemplifies when the switch elements 42 and 43 are implemented by single conductive MOS transistors.

In the first-layer planarizing film (first planarizing film) 74, a contact portion is formed at the portion corresponding to the output node $N_{out}$ of FIG. 5. The contact portion corresponds to the contact portions 55 and 59 in FIGS. 9A and 9B. That is, particularly, as can be seen from the plan pattern view of FIG. 15A, two contact portions 55 and 59 exist, when the first-layer planarizing film 74 is formed.

As the next process, a conductive thin film is made of, for example, ITO on the first planarizing film 74 (Step S23), and then, the relay wire 76 is formed by patterning in a desired circuit pattern by photolithography (Step S24). Next, the second planarizing film 77 is formed by applying, exposing, developing, and burning the material of the second planarizing film 77, on the first planarizing film 74, to cover the relay wire 76 (step S25).

Next, a conductive thin film having a high reflection ratio is made of Ag/Al on the second planarizing film 77 (Step S26), and then, the pixel electrode 79 that is a reflective electrode is formed by patterning in a desired pixel electrode pattern by photolithography (Step S27). The pixel array substrate structure according to the embodiment is formed by a series of the following processes. Thereafter, this proceeds to a cell process.

FIG. 16A is a plan pattern view schematically showing a plan pattern of a pixel circuit when the pixel electrode 79 is formed and FIG. 16B is a cross-sectional view taken along the line XVIB-XVIB of the plan pattern view of FIG. 16A.

As can be seen from FIG. 16A, when the pixel electrode 79 is formed, one contact portion exists at the center portion of the pixel electrode 45 and at the center portions of the pixel electrodes $46_A$ and $46_B$, respectively, that is, three contact portions 60, 56, and 57 exist.

(Material of Planarizing Film)

Next, the materials of the first and second planarizing films 74 (51) and 77 (52), in more detail, the materials of the planarizing films 74 and 77 applied to a two-layer structure are described.

A material having high melt fluidity is effectively used in order to achieve high flatness in a planarizing film having a single-layer structure. However, when a material having high melt fluidity, the contact hole formed in the planarizing film is expanded by the melt flow in high-temperature burning. Further, the widened region of the contact hole becomes a dispersion reflection region, that is, an optically unavailable region. The melt flow is one of the indexes showing fluidity or machinability of a molten polymer.

The first planarizing film 74 is made of a material having high melt fluidity at the first layer, the relay wire 76 is formed on the planarizing film 74, and then, the second planarizing film 77 is made of material having low melt fluidity at the second layer, in contrast to the first layer. In this configuration, the glass transition point $T_g$ of the second-layer planarizing film 77 is set higher than the burning temperature T in the burning process after developing the second-layer planarizing film 77.

In this configuration, a material having a glass transition point $T_g$ higher than a burning temperature T ($T_g > T$) is a low-melt fluidity material and a material having a glass transition point $T_g$ equal to or less than a burning temperature T ($T_g \leq T$) is a high-melt fluidity material. In this configuration, the glass transition point $T_g$ is a temperature at which the thermodynamic differential amount rapidly changes from a crystalline value to a liquid value when the temperature is changed.

Figure 17A:
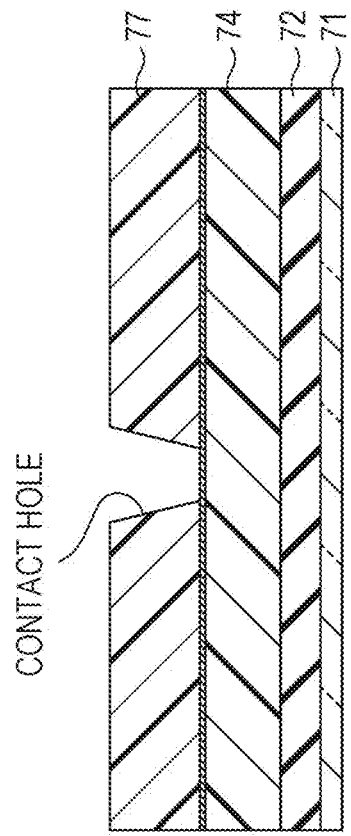
FIGS. 17A to 17C are illustrative views of melt fluidity of a second-layer planarizing film.
Figure 17C:
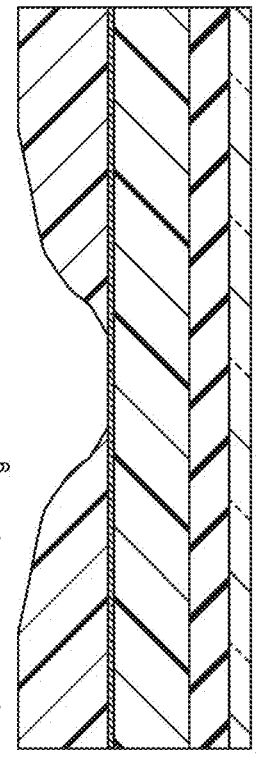

In the melt fluidity, there is a problem in the process of Step S25 in the manufacturing process described above (see FIG. 14), that is, in the process of applying, exposing, developing, and burning the material of the second-layer planarizing film 77. That is, as shown in FIGS. 17A to 17C, the second-layer planarizing film 77 applied on the first-layer planarizing film 75 is exposed/developed in FIG. 17A and then burning is performed at the burning temperature T, but there is a large difference in the optically unavailable region that is the dispersion reflection region according to the melt fluidity of the material.

Figure 17B:
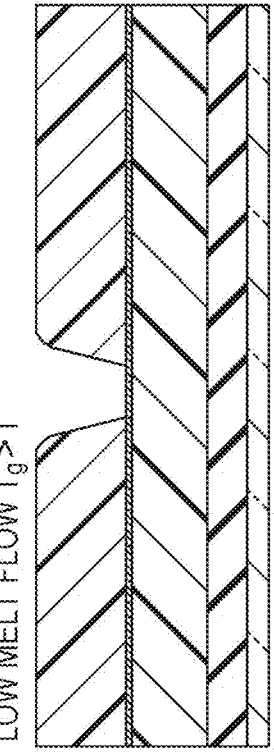

In detail, when the material of the second-layer planarizing film 77 is a low-melt fluidity material, that is, a material having a glass transition point $T_g$ higher than a burning temperature T in FIG. 17B, it is possible to suppress the expansion of the contact hole (corresponding to the contact hole $78_A$ of FIG. 12) formed in the planarizing film 77 due to the high-temperature burning. On the other hand, when the material of the second-layer planarizing film 77 is a high-melt fluidity material, that is, a material having a glass transition point $T_g$ equal to or less than a burning temperature T in FIG. 17C, the contact hole is expanded by the melt flow in the high-temperature burning.

Figure 18A:
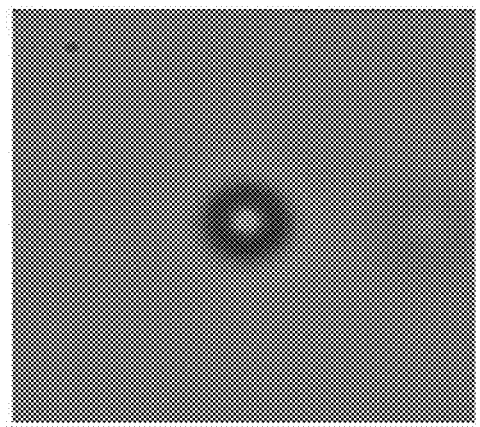
FIGS. 18A and 18B are illustrative views when the material of the second-layer planarizing film is a material having low melt fluidity.
Figure 18B:
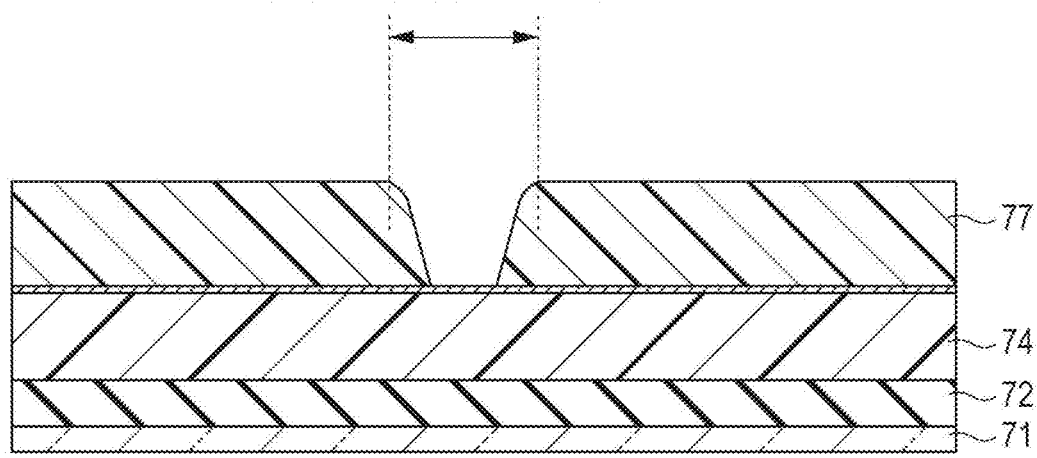

FIGS. 18A and 18B show the state of a contact hole when the material of the second-layer planarizing film 77 is a low-melt fluidity material. FIG. 18A shows a microscopic surface image of the contact hole by EPI-illumination of reflecting light from a sample and enlarging and measuring the sample, and FIG. 18B shows a cross-section of the contact hole. Since a low-melt fluidity material is used as the material of the second-layer planarizing film 77, it is possible to suppress the expansion of the contact hole due to the high-temperature burning, such that it can be seen that the optically unavailable region that is the dispersion reflection region is small.

Figure 19A:
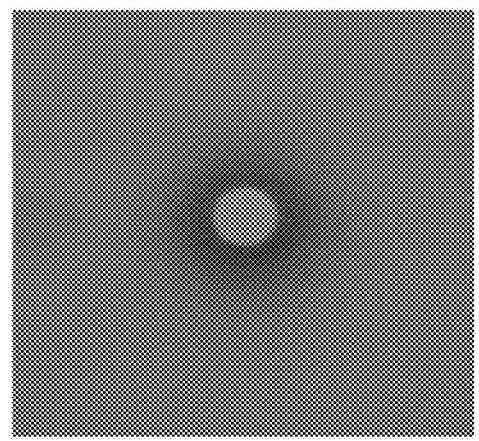
FIGS. 19A and 19B are illustrative views when the material of the second-layer planarizing film is a material having high melt fluidity.
Figure 19B:
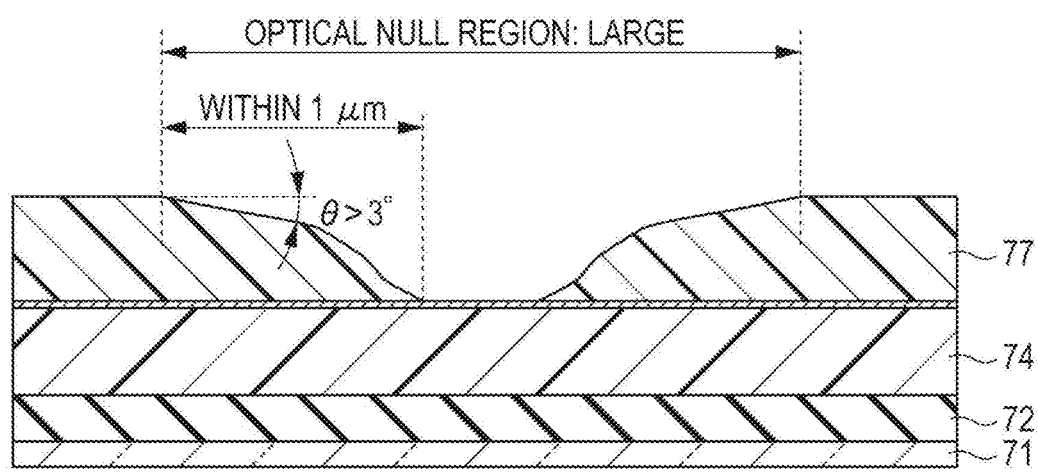

FIGS. 19A and 19B show the state of a contact hole when the material of the second-layer planarizing film 77 is a high-melt fluidity material. FIG. 19A shows a microscopic surface image of a contact hole by EPI-illumination and FIG. 19B shows a cross-section of the contact hole. Since a high-melt fluidity material is used as the material of the second-layer planarizing film 77, the contact hole is expanded according to the melt flow in the high-temperature burning, such that the optically unavailable region increases in comparison to using a low-melt fluidity material.

As described above, it is possible to suppress expansion of the contact hole formed in the planarizing film 77 by the high-temperature burning, by using the low-melt fluidity material having a glass transition point $T_g$ higher than the burning temperature T as the second-layer planarizing film 77, such that it is possible to decrease the expansion region of the contact hole. Therefore, it is possible to decrease the optically unavailable region that is the dispersion reflection region influencing the image gradation, such that it is possible to greatly contribute to improving the display grade of a display device.

In this configuration, a rectangular shape is more preferable than a circular shape, as the shape of the contact hole formed in the second-layer planarizing film 77, that is, the contact holes of the contact portions 60, 56, and 57 of the sub-pixel electrodes 45, $46_A$, and $46_B$ of FIGS. 9A and 9B. The reason is because, for the circular shape, in addition to the optically unavailable region of the contact portion, the tapered region expanding around it becomes a dispersion factor, such that the practical reflection area is significantly reduced.

Further, it is preferable that an area at an inclination angle of 3° or more shown in FIG. 19B be within 1 μm from the bottom end of the contact in the contact hole formed in the second-layer planarizing film 77.

The reason is because a reflection region at an inclination angle of 3° or more becomes a factor decreasing the reflection ratio due to dispersion in the reflective type ideally implementing specular reflection, such that it is possible to implement display with a high reflection ratio by increasing the area of a regular reflection region as large as possible.

In the pixel array substrate structure according to the embodiment described above, although when a liquid crystal display of which the pixel has the MIP pixel structure is applied was exemplified, the application example is not limited thereto, that is, it does not matter whether the pixel has the MIP pixel structure. However, it is possible to achieve the specific operation and effect described below by applying the pixel array substrate structure according to the embodiment to a liquid crystal display having the MIP pixel structure.

According to the MIP pixel structure, the circuit density is high and the layout structure on the TFT array substrate is complicated, because many circuit components, such as transistors, and contact portions exist in one pixel. When the pixel electrode is formed as a reflective electrode on the TFT array substrate, it is possible to freely determine the layout of the contact portion influencing the image grade, in design, on the relay wire 76 formed on the first-layer planarizing film 74, by employing the pixel array substrate structure according to the embodiment. As a result, it is possible to decrease the circuit density and implement a specific design for the pixel memory and the pixel switch (corresponding to the switch element SW of FIG. 11).

<2. Modified Example>

Although it was exemplified when the present disclosure is applied to a liquid crystal display in the above embodiment, the present disclosure is not limited to a VA type liquid crystal display or a common liquid crystal display, in technical terms, except for the technical term of disposing a VAP (alignment factor) at the center of the sub-pixel electrode. That is, the present disclosure can be generally applied to liquid crystal displays using an organic EL (electro luminescence) element, an inorganic EL element, and LED element, and a semiconductor laser element, as the optical element (light emitting element) of a pixel, in addition to a general liquid crystal display layer.

In this case, it does not matter whether the pixel is a pixel (MIP pixel) including a built-in memory. However, in the MIP pixel structure, since a plurality of circuit components, such as transistors, or contact holes are in one pixel 4, there is no room for the layout in the area. Therefore, from the viewpoint of achieving high accuracy, the present disclosure can achieve sufficient operation and effect by being applied to a liquid crystal display device having the MIP pixel structure because the contact number or the number of wires is not increased. Further, in this case, obviously, the present disclosure can be applied to a display device in which MIP is combined with an organic EL (electro luminescence) element, an inorganic EL element, and LED element, and a semiconductor laser element.

Further, whether the applied display device has the pixel structure employing the area gradation method or not does not matter in the technical items that the planarizing film is formed in a two-layer structure, the metal wire is formed between the two planarizing films of the two-layer structure, and the two electrodes disposed on the upper planarizing film are electrically connected by the metal wire. That is, the present disclosure can be generally applied to display devices employing the configuration in which two electrodes disposed on a planarizing film are electrically connected.

Further, in the embodiment described above, although it was exemplified that the present disclosure is applied to a reflective liquid crystal display, the present disclosure is not limited to the reflective liquid crystal display. That is, the present disclosure can be applied to a transmissive liquid crystal display or a semi-transmissive liquid crystal display, similar to the reflective liquid crystal display, in the technical terms of rewriting of pixel data, pixel structure, and pixel array substrate structure. However, since it is possible to achieve higher specular reflection of the sub-pixel electrode that is the reflective electrode, by applying the present disclosure to the reflective display device, in the technical terms of the pixel array substrate structure, it is possible to sufficiently achieve the operation and effect.

<3. Electronic Apparatus>

A electronic apparatus according to an embodiment of the present disclosure described above can be used as a display device for electronic apparatuses in any field, which displays a video signal input to the electronic apparatuses or a video signal generated in the electronic apparatuses as an image or video. For example, the present disclosure may be used as a display device for various electronic apparatuses shown in FIGS. 20 to 22, for example, the display device for a digital camera or a video camera, and the display device for portable terminal devices, such as a mobile phone, a PDA (Personal Digital Assistant), or an electronic book.

The display device according to an embodiment of the present disclosure includes a module-shaped product having a sealed configuration. A display module formed by bonding an opposite portion, such as transparent glass, to the pixel array can be exemplified. A glass filter or a protective film may be disposed at the transparent opposite portion. Further, a circuit unit or an FPC (flexible printed circuit) for outputting signals to a pixel array unit from the outside may be disposed in the display module.

A detailed example of an electronic apparatus to which the present disclosure is applied is described hereafter.

Figure 20A:
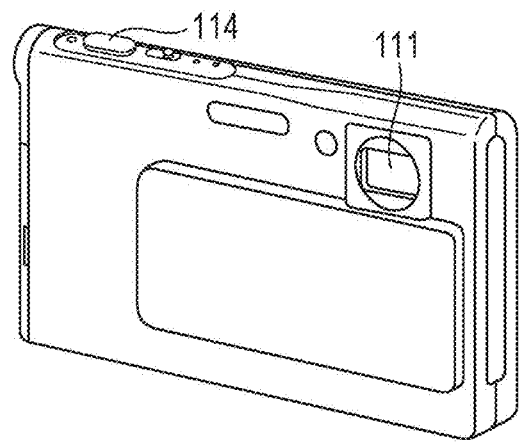
Figure 20B:
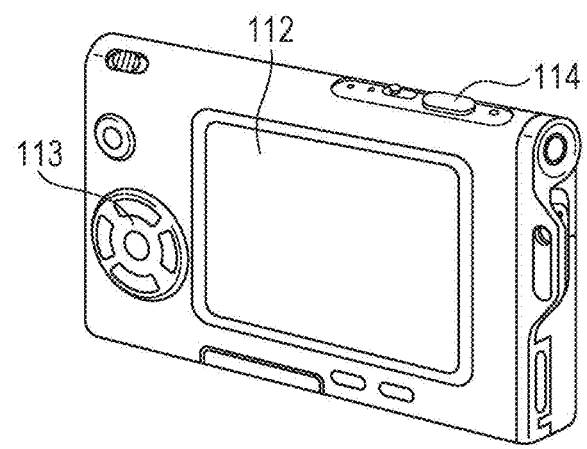

FIGS. 20A and 20B are perspective views showing the external appearance of a digital camera using an embodiment of the present disclosure, in which FIG. 20A is a perspective view seen from the front side and FIG. 20B is a perspective view seen from the rear side. A digital camera according to the application example includes a light emitting part 111 for a flash, a display unit 112, a menu switch 113, and a shutter button 114, in which the display device according to an embodiment of the present disclosure is used as the display unit 112.

Figure 21:
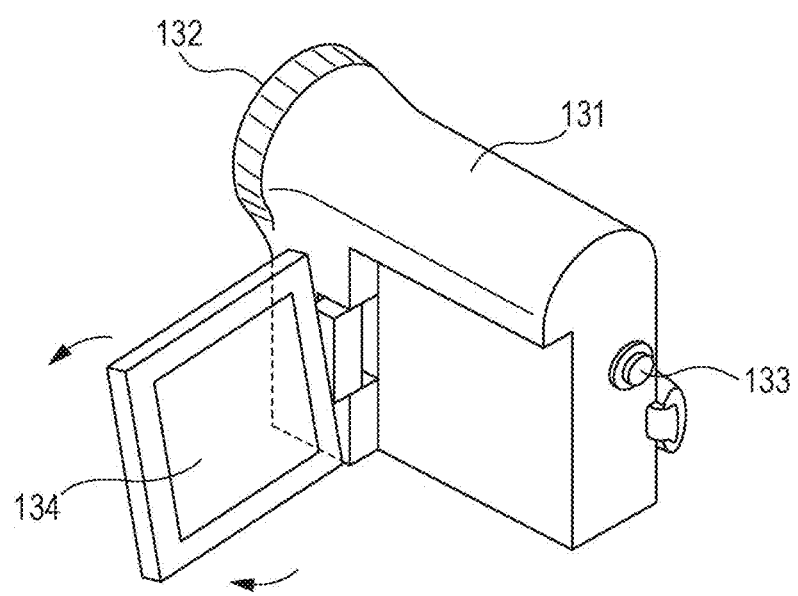
FIG. 21 is a perspective view showing the external appearance of a video camera using an embodiment of the present disclosure.

FIG. 21 is a perspective view showing the external appearance of a video camera using the present disclosure. A video camera according to the application example includes a main body 131, a lens 132 for recording an object, at the front side, a start/stop switch 133 for recording, and a display unit 134, in which the display device according to an embodiment of the present disclosure is used as the display unit 134.

FIGS. 22A to 22G are external views showing a portable terminal device, for example, a mobile phone using the present disclosure, in which FIG. 22A is a front view, FIG. 22B is a side view, FIG. 22C is a front view with the phone closed, FIG. 22D is a left side view, FIG. 22E is a right side view, FIG. 22F is a plan view, and FIG. 22G is a bottom view. A mobile phone according to the application example includes an upper case 141, a lower case 142, a connecting portion 143 (hinged portion in this example), a display 144, a sub-display 145, a picture light 145, and a camera 147. Further, the mobile phone according to the application example is manufactured by using the display device according to an embodiment of the present disclosure as the display 144 or the sub-display 145.

In this example, a mobile phone was exemplified as a portable terminal device, but as described above, the present disclosure may be applied to various portable terminal devices, such as a PDA or an electronic book. Further, particularly, when the display device according to an embodiment of the present disclosure is a reflective liquid crystal display, since power for emitting light therein is not necessary, it is possible to considerably reduce power consumption of portable terminal devices by using the display device for the display devices of portable terminal devices that are frequently used outside. These features are the same in a digital camera or a video camera that is frequently used outside.

The present disclosure contains subject matter related to that disclosed in Japanese Priority Patent Application JP 2010-283487 filed in the Japan Patent Office on Dec. 20, 2010 filed in the Japan Patent Office on Month d, 20XX), the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A pixel structure comprising:
   a planarizing film on a substrate on which a circuit section is formed;
   a plurality of sub-pixel electrodes disposed to be separated from each other on the planarizing film, the sub-pixel electrodes including a plurality of first electrodes and a second electrode;
   a plurality of drive circuits including a first drive circuit and a second drive circuit;
   a first relay wiring;
   a second relay wiring; and
   a signal line configured to supply pixel signals, wherein
   the first electrodes are electrically connected to the first drive circuit by the first relay wiring and further electrically connected to the signal line via the first drive circuit,
   the second electrode is electrically connected to the second drive circuit by the second relay wiring and further electrically connected to the signal line via the second drive circuit,
   the signal line is configured to supply the pixel signals to both of:
     the first drive circuit, which is configured to drive the first electrodes without driving the second electrode, and
     the second drive circuit, which is configured to drive the second electrode without driving the first electrodes, and
   the first relay wiring crosses the second electrode in a planar view.

2. The pixel structure according to claim 1, wherein the first electrodes are disposed with the second electrode interposed between the first electrodes.

3. The pixel structure according to claim 2, wherein respective sizes of the first electrodes and the second electrode are equal.

4. The pixel structure according to claim 3, wherein each of the first electrodes and the second electrode has a square shape.

5. The pixel structure according to claim 1, wherein the first relay wiring is disposed under the second electrode and connected to the first electrodes.

6. The pixel structure according to claim 5, wherein
the planarizing film includes a first planarizing film and a second planarizing film that are stacked in this order on the substrate, and
the first and second relay wirings formed on the first planarizing film are covered by the second planarizing film.

7. The pixel structure according to claim 6, wherein the second planarizing film has contact parts disposed in positions corresponding to central positions of respective ones of the first electrodes.

8. The pixel structure according to claim 6, wherein
the first planarizing film includes a first contact part for electrically connecting the second drive circuit to the second relay wiring, and
the second planarizing film includes second contact parts each electrically connecting one of the first electrodes to the first relay wiring.

9. The pixel structure according to claim 8, wherein second contact parts are disposed at positions different from the first contact part as viewed in the planar view.

10. The pixel structure according to claim 9, wherein the second contact parts are disposed in positions corresponding to central positions of respective ones of the first electrodes in the second planarizing film.

11. The pixel structure according to claim 1, wherein the first relay wiring couples between the first electrodes and passes under the second electrode.

12. The pixel structure according to claim 1, wherein the circuit section has a memory for retaining a signal provided from the signal line.

13. A display device formed by arranging a pixel having a pixel structure, the pixel structure comprising:
    a planarizing film on a substrate on which a circuit section is formed;
    a plurality of sub-pixel electrodes disposed to be separated from each other on the planarizing film, the sub-pixel electrodes including a plurality of first electrodes and a second electrode;
    a plurality of drive circuits including a first drive circuit and a second drive circuit;
    a first relay wiring;
    a second relay wiring; and
    a signal line configured to supply pixel signals, wherein
    the first electrodes are electrically connected to the first drive circuit by the first relay wiring and further electrically connected to a signal line via the first drive circuit,
    the second electrode is connected electrically to the second drive circuit by the second relay wiring and further electrically connected to the signal line via the second drive circuit,
    the signal line is configured to supply the pixel signals to both of:
        the first drive circuit, which is configured to drive the first electrodes without driving the second electrode, and
        the second drive circuit, which is configured to drive the second electrode without driving the first electrodes, and
    the first relay wiring crosses the second electrode in a planar view.

14. The pixel structure according to claim 1, wherein
the first drive circuit is configured to drive the first electrodes without driving the second electrode via the first relay wiring, which is connected to the first electrodes but not directly connected to the second relay wiring, and
the second drive circuit is configured to drive the second electrode without driving the first electrodes via the second relay wiring, which is connected to the second electrode but not directly connected to the first relay wiring.

* * * * *